United States Patent
Zagoskin

(12) 
(10) Patent No.: US 6,563,311 B2
(45) Date of Patent: *May 13, 2003

(54) QUANTUM COMPUTING METHOD USING MAGNETIC FLUX STATES AT A JOSEPHSON JUNCTION

(75) Inventor: Alexandre M. Zagoskin, Vancouver (CA)

(73) Assignee: D-Wave Systems, Inc., Vancouver (CA)

( * ) Notice: Subject to any disclaimer, the term of this patent is extended or adjusted under 35 U.S.C. 154(b) by 0 days.

This patent is subject to a terminal disclaimer.

(21) Appl. No.: 09/855,817

(22) Filed: May 14, 2001

(65) Prior Publication Data

US 2001/0020701 A1 Sep. 13, 2001

Related U.S. Application Data

(62) Division of application No. 09/452,749, filed on Dec. 1, 1999.

(51) Int. Cl.[7] .......................... H01L 39/22; G06N 1/00; G01R 33/035; G06F 7/48
(52) U.S. Cl. .......................... 324/248; 257/31; 257/33; 505/162; 505/170; 505/190; 505/829; 708/677
(58) Field of Search ..................... 324/248; 257/31–34; 708/677, 679, 832, 400; 505/162, 170, 190, 829, 846, 702; 326/3–7

(56) References Cited

U.S. PATENT DOCUMENTS

| 3,953,749 A | * 4/1976 | Baechtold et al. ........... 307/277 |
| 5,157,466 A | * 10/1992 | Char et al ..................... 357/5 |
| 5,274,249 A | 12/1993 | Xi et al. ......................... 257/39 |
| 5,560,836 A | 10/1996 | Nagaishi ........................ 216/3 |

(List continued on next page.)

OTHER PUBLICATIONS

Shnirman et al., "Quantum measurements performed with a single–electron transistor", Physical Review B vol. 57, No. 24, pp 15400–15407, Jun. 15, 1998.*

Ioffe, et al.: "Environmentally decoupled sds–wave Josephson junctions for quantum computing", Nature, vol. 398, pp 679–681, Apr. 22, 1999.*

D. Agterberg, and M. Sigrist, "Asymmetric magnetic interference patterns in O–n Josephson junctions", LANL preprinted cond-mat/9711157 (Nov. 17, 1997). pp. 1–4.

(List continued on next page.)

*Primary Examiner*—Gerard R. Strecker
(74) *Attorney, Agent, or Firm*—Pennie & Edmonds LLP

(57) ABSTRACT

A solid-state quantum computing structure includes a d-wave superconductor in sets of islands that clean Josephson junctions separate from a first superconducting bank. The d-wave superconductor causes the ground state for the supercurrent at each junction to be doubly degenerate, with two supercurrent ground states having distinct magnetic moments. These quantum states of the supercurrents at the junctions create qubits for quantum computing. The quantum states can be uniformly initialized from the bank, and the crystal orientations of the islands relative to the bank influence the initial quantum state and tunneling probabilities between the ground states. A second bank, which a Josephson junction separates from the first bank, can be coupled to the islands through single electron transistors for selectably initializing one or more of the supercurrents in a different quantum state. Single electron transistors can also be used between the islands to control entanglements while the quantum states evolve. After the quantum states have evolved to complete a calculation, grounding the islands, for example, through yet another set of single electron transistors, fixes the junctions in states having definite magnetic moments and facilitates measurement of the supercurrent when determining a result of the quantum computing.

14 Claims, 6 Drawing Sheets

U.S. PATENT DOCUMENTS

| | | | | |
|---|---|---|---|---|
| 5,571,778 | A | 11/1996 | Fujimoto et al. | 505/329 |
| 5,694,059 | A | 12/1997 | Wada et al. | 326/62 |
| 5,710,051 | A | 1/1998 | Park et al. | 438/149 |
| 5,767,043 | A | 6/1998 | Cantor et al. | 505/162 |
| 5,768,297 | A | 6/1998 | Shor | 371/40.11 |
| 5,838,021 | A | 11/1998 | Ancona | 257/30 |
| 5,844,279 | A | 12/1998 | Tanamoto et al. | 257/347 |
| 5,883,051 | A | * 3/1999 | Ishimaru et al. | 505/190 |
| 5,917,322 | A | 6/1999 | Gershenfeld et al. | 324/307 |
| 5,997,958 | A | 12/1999 | Sato et al. | 427/468 |
| 6,010,934 | A | 1/2000 | Wu | 438/264 |
| 6,016,433 | A | 1/2000 | Mizuno et al. | 505/190 |
| 6,060,723 | A | 5/2000 | Nakazato et al. | 257/315 |
| 6,069,380 | A | 5/2000 | Chou et al. | 257/315 |
| 6,169,308 | B1 | 1/2001 | Sunami et al. | 257/321 |
| 6,204,517 | B1 | 3/2001 | Wu | 257/51 |
| 6,211,013 | B1 | 4/2001 | Park et al. | 438/257 |
| 6,301,029 | B1 | * 10/2001 | Azuma | 359/1 |
| 6,317,766 | B1 | * 11/2001 | Grover | 708/400 |

OTHER PUBLICATIONS

Ahn, C. H. et al., "Electrostatic Modulation of Superconductivity in Ultrathin GdBa2Cu3O7-x Films", Science, vol. 284, pp. 1152–1155, (May 14, 1999).

L. Alff, H. Takashima, S. Kashiwaya, N. Terada, T. Ito, K. Oka, Y. Tanaka, and M. Kayanagi, "Orientation Dependence of Tunneling Spectra in YBCO and NCCO", Proc. of $M^2$S–HTSC–V, Feb./Mar., 1997 Beijing, China. pp. 1–2.

N. Allsopp, J. Sanchez Canizares, R. Raimondi, and C. Lambert, "Giant Conductance Oscillations In Mesoscopic Andreev Interferometers", LANL preprint cond–mat/9504113 (Apr. 1995). pp. 1–4.

A. Altland, B. Simons, and D. Taras–Semchuk, "Field theory of mesoscopic fluctuations in superconductor/normal–metal systems", JETP Lett., 67, No. 1, Jan. 10, 1998, pp. 23–27.

B.L. Altshuler et al. eds., *Mesoscopic Phenomenon Solids*, (North–Holland 1991) [Preface only].

N. Argaman, "Non–equilibrium Josephson–like effects in mesoscopic S–N–S junctions", LANL preprint cond–mat/9709001 (Aug. 29, 1997). pp. 1–4.

Ashkroft and Mermin, "Condensed Matter Physics", pp. 726–753 ( Saunder College Publishing, 1976).

(Author Unknown), "Definition of mesoscopic", http://physics.about.com/library/dict/bldefmesoscopic.htm, About.com Inc. (2001). Accessed on date unknown.

D. V. Averin, A. N. Korotkov, A. J. Manninen, and J. P. Pekola, "Resonant Tunneling through a Macroscopic Charge State in a Superconducting Single Electron Transistor", Phys. Rev. Lett. 78, pp. 4821–4824 (1997).

P. Bagwell, "Suppression of the Josephson current through a narrow, mesoscopic, semiconductor channel by a single impurity", Phys. Rev. B, 46:19, 12573–12586 (Nov. 15, 1992).

Y. Barash, A. Galaktionov, and A. Zaikin, "Charge transport in junctions between d–wave superconductors", Phys. Rev. B, 52:1, 665–682 (Jul. 1, 1995).

Y. Barash, H. Burkhardt, and D. Rainer, "Low–Temperature Anomaly in the Josephson Critical Current of Junctions in d–Wave Superconductors", Phys. Rev. Lett., 77:19, 4070–4073 (Nov. 4, 1996).

Y. Barash, "Quasiparticle Interface States in Junctions Involving d–wave Superconductors", LANL preprint cond–mat/9907277 (Jul. 19, 1999).

J. Bardeen, and J. Johnson, "Josephson Current Flow in Pure Superconducting–Normal–Superconducting Junctions", Phys. Rev. B, 5:1, 72–78 (Jan. 1, 1972).

Adriano Barenco, Todd A. Brun et al., "Effects of noise on quantum error correction algorithms", LANL preprint quant–ph/9612047 (Dec. 18, 1996). pp. 1–26.

A. Barenco et al., "Elementary gates for Quantum Computation", Phys. Rev. A 52, pp. 3457–3467 (1995).

A. Barone and G. Paterno, "Physics and Applications of the Josephson Effect", Joh Wiley & Sons, New York, (1982) [Hard Copy Chapter 1 Only].

V. Barzykin, and A. Zagoskin, "Coherent transport and nonlocality in mesoscopic SNS junctions: anomalous magnetic interference patterns", LANL preprint cond–mat/9805104 (Nov. 16, 1998). pp. 1–13.

David Beckman, Amalavoyal N. Chari et al., "Efficient networks for quantum factoring", LANL preprint quant–ph/9602016 (Feb. 21, 1996). pp. 1–56.

C. Beenakker, J.A. Melsen, and P.W. Brouwer, "Giant backscattering in angle–resolved Andreev reflection", LANL preprint cnod–mat/9501003 (Jan. 3, 1995). pp. 1–4.

P. Benioff, "Quantum Robots Plus Environments", LANL preprint quant–ph/9807032 (1998). pp. 1–6.

G. P. Berman, A. R. Bishop, G. D. Doolen, G. V. Lopez, V. I. Tsifrinovich, "Influence of Non–Resonant Effects on the Dynamics of Quantum Logic Gates at Room Temperature", LANL preprint quant–ph/9906109 (1999). pp. 1–14.

M. Biskup, P. Cejnar and R. Kotecky, "Decoherence and Efficiency of Quantum Error Correction", LANL preprint quant–ph/9608010 (Apr. 7, 1997). pp. 1–13.

M. Blaauboer, R. Koperdraad, A. Lodder, and D. Lenstra, "Size–effects in the Density of States in NS and DND junctions", LANL preprint cond–mat/9605078 (May 13, 1996). pp. 1–9.

Alexandre Blais and Alexandre M. Zagoskin, "Operation of universal gates in a solid state quantum computer based on clean Josephson junctions between d–wave superconductors", LANL preprint quant–ph/9905043 (1999). pp. 1–4.

G. Blonder, M. Tinkham, and T. Klapwijk, "Transition from metallic to tunneling regimes in superconducting microconstrictions: Excess current, charge imbalance and supercurrent conversion", Phys. Rev. B, 25:7, 4515–4532 (Apr. 1, 1982).

M. Bocko, A. Herr and M. Feldman, "Prospect for Quantum Coherent Computation Using Superconducting Electronics", IEEE Trans. App. Sup. 7, 3638 (1997). pp. 3638–3641.

N.H. Bonadeo et al., "Coherent Optical Control of the Quantum State of a Single Quantum Dot", Science, 5395:282, 1473 (Nov. 20, 1998).

S. Bose, P.L. Knight et al., "Implementations of Quantum Logic: Fundamental and Experimental Limits", LANL preprint quant–ph/9712021 (Dec. 10, 1997).

D. Aharonov and M. Ben–Or, "Fault–Tolerant Quantum Computation With Constant Error", LANL preprint quant–ph/9611025 (Nov. 15, 1996).

D. Bouwmeester, A. Eckert, and A. Zeilinger, eds., The Physics of Quantum Information, p. 97 ( Springer, 2001).

Samuel L. Braunstein, "Quantum error correction of dephasing in 3 qubits", LANL preprint quant–ph/9603024 (Mar. 19, 1996).

Samuel L. Braunstein and John A. Smolin, "Perfect quantum error correction coding in 24 laser pluses", LANL preprint quant–ph/9604036 (Oct. 22, 1996).

H.J. Briegel et al., "Quantum communication and the creation of maximally entangled pairs of atoms over a noisy channel", LANL preprint quant–ph/9712027 (Dec. 11, 1997).

H.J. Briegel, W. Dur et al., "Quantum repeaters for communication", LANL preprint quant–ph/9803056 (Mar. 20, 1998).

C. Bruder, A. van Otterlo and G.T. Zimanyi, "Tunnel junctions of unconventional superconductors", Phys. Rev. B, 51:18, 12904–12907 (May 1, 1995).

Dagmar Bruss, "Optimal eavesdropping in quantum cryptography with six states", LANL preprint quant–ph/9805019 (Oct. 8, 1998).

Dagmar Bruss, Artur Ekert and Chiara Macchiavello, "Optimal universal quantum cloning and state estimation", LANL preprint quant–ph/9712019 (Oct. 8, 1998).

V. Buzek and M. Hillery, "Universal Optimal Cloning of Qubits and Quantum Registers", LANL preprint quant–ph/9801009 (Jan. 7, 1998).

V. Buzek, S.L. Braunstein et al., "Quantum copying: A network", LANL preprint quant–ph/9703046 (Mar. 24, 1997).

A.R. Calderbank, E.M. Rains et al., "Quantum Error Correction Via Codes Over GF(4)", LANL preprint quant–ph/9608006 (Sep. 10, 1997).

A.R. Calderbank, E.M. Rains et al., "Quantum Error Correction and Orthogonal Geometry", LANL preprint quant–ph/9605005 (Jul. 2, 1996).

A.R. Calderbank and Peter W. Shor, "Good quantum error–correcting codes exist", LANL preprint quant–ph/9512032 (Apr. 16, 1996).

P. Carruthers, and M. Nieto, "Phase and Angle Variables in Quantum Mechanics", Rev. Mod. Phys., 40, 411–440 (Apr. 1968).

Li–Fu Chang, and P. Bagwell, "Ballistic Josephson–current flow through an asymmetric superconductor–normal–metal–superconductor junction", Phys. Rev. B., 49:22, 15853–15863 (Jun. 1, 1994).

H.F. Chau, "Five Quantum Register Error Correction Code For Higher Spin Systems", LANL preprint quant–ph/9702033 (May 19, 1997).

H. F. Chau, "Good Quantum Convolutional Error Correction Codes and Their Decoding Algorithm Exist", LANL preprint quant–ph/9806032 (1998).

H. F. Chau, "Quantum Convolutional Error Correction Codes", LANL preprint quant–ph/9802009 (1998).

P. Chaudhari, et al., "The Microstructure of High–Critical Current Superconducting Films", Science 238:4825, pp. 342–344 (1987).

P. Chaudhari, et al., "Direct Measurement of the superconducting properties of single grain boundaries in YBa2Cu3O7—delta", Phys. Rev. Lett. 60, p. 1653 (1988).

A. Chrestin, T. Matsuyama and U. Merkt, "Evidence for a proximity–induced energy gap in Nb/InAs/Nb junctions", Physical Review B, 55:13, 8457–8465 (Apr. 1, 1997).

Isaac L. Chuang and R. Laflamme, "Quantum Error Correction by Coding", LANL preprint quant–ph/9511003 (Nov. 3, 1995).

Isaac L. Chuang and Yoshihisa Yamamoto, "A Simple Quantum Computer", LANL preprint quant–ph/9505011 (May 22, 1995).

Isaac L. Chuang and Yoshihisa Yamamoto, "The Persistent Quantum Bit", LANL preprint quant–ph/9604030 (Apr. 25, 1996).

I. L. Chuang, N. Gershenfeld, and M. Kubinec, "Experimental Implementation of Fast Quantum Searching", Phys. Rev. Lett., 80:15, 3408–3411 (Apr. 13, 1998).

J.I. Cirac and N. Gissin, "Coherent eavesdropping stratagies for the 4 state quantum cryptography protocol", LANL preprint quant–ph/9702002 (Jan. 31, 1997).

Daniel Clery, "New clues to superconductivity", Science, 265:5174, 860 (Aug. 12, 1994).

Richard Cleve and Daniel Gottesman, "Efficient Computations of Encodings for Quantum Error Correction", LANL preprint quant–ph/9607030 (Jul. 31, 1996).

Richard Cleve and David P. DiVincenzo, "Schumacher's quantum data compression as a quantum computation", LANL preprint quant–ph/9603009 (Mar. 7, 1996).

David Collins, K. W. Kim, W. C. Hoton, "Deutsch–Jozsa Algorithm as a test of Quantum Computation", LANL preprint quant–ph/9807012 (1998).

Douglas M. Considine, "Van Nostrand's Scientific Encyclopedia", 7th edition, Douglas M. Considine et al., eds., New York.

K. Constantinian, G. Ovsyannikov, A. Mashtakov, J. Ramos, Z. Ivanov, J. Mygind, and N. Pederson, "Microwave dynamics of YBCO bi–epitaxial Josephson structures", Physica C, 273, 21 (1996).

R. De Bruyn Ouboter & A.N. Omelyanchouk, "Macroscopic quantum interference effects in superconducting multiterminal microstructures", Superlattices and Microstructures, 25:5/6, 1005–1017 (1999).

R. De Bruyn Ouboter and A.N. Omelyanchouk, "Four–terminal SQUID:Magnetic Flux Switching in Bistable State and Noise", LANL preprint cond–mat/9805109 (May 9, 1998).

H. De Raedt, K. Michielsen, and T. Klapwijk, "Andreev reflection in nanoscale metal–superconductor devices", Phys. Rev. B, 50:1, 631–634 (Jul. 1, 1994).

R. Derka, V. Buzek and A.K. Ekert, "Universal Algorithm for Optimal Estimation of Quantum States from Finite Ensembles", LANL preprint quant–ph/9707028 (Jul. 16, 1997).

D. Deutsch, "Quantum Theory, the Church–Turing Principle and the Universal Quantum computer," Proc. of the R. Soc. Of London A 400, pp. 97–117 (1985).

David Deutsch, Artur Ekert et al., "Quantum privacy amplification and the security of quantum cryptography over noisy channels", LANL preprint quant–ph/9604039 (Apr. 30, 1996).

T. Devereaux, and P. Fulde, "Multiple Andreev scattering in superconductor–normal metal–superconductor junctions as a test for anisotropic electron pairing", Phys. Rev. B, 47:21, 14638–14641 (Jun. 1, 1993).

C. D'Helon and G.J. Milburn, "Correcting the effects of spontaneous emission on cold–trapped ions", LANL preprint quant–ph/9610031 (May 19, 1997).

C. D'Helon, G.J. Milburn, "Quantum Measurements with a Quantum Computer", LANL preprint quant–ph/9705014 (1997).

D. Dimos, et al. "Orientation dependence of grain–boundary critical currents in YBa2Cu3O7—delta bicrystals", Phys. Rev. Lett. 61, 219 (1988).

D. P. DiVincenzo, and D. Loss, "Quantum Computers and Quantum Coherence", LANL preprint cond–mat/9901137 (1999).

D. DiVincenzo, "Quantum Computing and Single–Qubit Measurements Using the Spin Filter Effect", LANL preprint cond–mat/9810295 v1, (Oct. 22, 1998).

D. DiVincenzo, "Quantum Computation", Science, 279, 5234 (Jan. 16, 1998).

David P. DiVincenzo and Peter W. Shor, "Fault–Tolerant Error Correction with Efficient Quantum Codes", LANL preprint quant–ph/9605031 (Aug. 23, 1996).

Lu–Ming Duan and Guang–Can Guo, "Optimal quantum codes for preventing collective amplitude damping" LANL preprint quant–ph/ 9804014 (Apr. 6, 1998).

Lu–Ming Duan and Guang–Can Guo, "Preserving coherence in quantum computation by pairing the quantum bits", LANL preprint quant–ph/9703040 (Oct. 3, 1997).

Lu–Ming Duan and Guang–Can Guo, "Decoherence of quantum registers", LANL preprint quant–ph/9703036 (Mar. 20, 1997).

Lu–Ming Duan and Guan–Can Guo, "Cooperative loss and decoherence in quantum computation and communication", LANL preprint quant–ph/9701020 (Jan. 16, 1997).

Lu–Ming Duan and Guang–Can Guo, "Reducing decoherence in quantum computer memory with all quantum bits coupling to the same environment", LANL preprint quant–ph/9612003 (Feb. 2, 1998).

C.B. Eom, A.F. Marshall et al., "Epitaxial and smooth films of a–axis YBaCuO", Science, 249:4976, 1549 (Sep. 28, 1990).

R. Fazio, G.M. Palma, and J. Siewert, "Fidelity and Leakage of Josephson Qubits", Phys. Rev. Lett. 83, 5385 (1999).

D. Feder, A. Beardsall, A. Berlinsky, and C. Kallin, "Twin boundaries in d–wave superconductors", Phys. Rev. B, 56:10, R5751–R5754 (Sep. 1, 1997).

M.V. Feigel'man et al., "Andreev Spectroscopy for Superconducting Phase Qubits", LANL preprint cond–mat/ 9907317 (Jul. 1999).

R. Feynman, "Stimulating Physics with Computers", Int. Journal of Theoretical Phys., 21:6/7, 467–488 (1982).

M. Fogelstrom, S. Yip, and J. Kurkijarvi, "Pinhole junctions in d–wave superconductors", LANL preprint cond–mat/ 9709120 (Sep. 10, 1997).

Christopher A. Fuchs, Nicolas Gisin, Robert B. Griffiths et al., "Optimal eavesdropping in quantum cryptography. I.", LANL preprint quant–ph/9701039 (Jan. 30, 1997).

A. Furusaki, "Josephson current carried by Andreev levels in superconducting quatum point Contacts" LANL preprint cond–mat/9811026 (1998).

M. Geller, "Current–carrying ground states in mesoscopic and macroscopic systems", Phys. Rev. B., 53:15, 9550–9553 (Apr. 15, 1996).

Neil A. Gershenfeld & Isaac L. Chuang, "Bulk spin–resonance quantum computation", Science, 5298:275, 350 (Jan. 17, 1997).

Neil Gershenfeld & Isaac L. Chuang, "Quantum Computing with Molecules", Scientific American, at http://www.sciam.com/1998/0698issue/0698gershenfeld.html (Jun. 1998). Accessed on Feb. 21, 2002.

V. Geshkenbein, A. Larkin, and A. Barone, "Vortices with half magnetic flux quanta in "heavy–fermion" superconductors", Phys. Rev. B, 36:1, 235–238 (Jul. 1, 1987).

K.M. Gheri, C. Saavedra et al., "Entanglement engineering of one–photon wavepackets using a single–atom source", LANL preprint quant–ph/9802060 (Feb. 25, 1998).

S.M. Girvin, L.I. Glazman et al., "Quantum Fluctuations and the Single–Junction Coulomb Blockade" Phys. Rev. Lett. 64:26, 3183–3186 (Jun. 25, 1990).

N. Gissin and S. Massar, "Optimal Quantum Cloning Machines", LANL preprint quant–ph/9705046 (Jul. 17, 1997).

N. Gissin and H. Bechmann–Pasquinucci, "Bell inequality, Bell states and maximally entangled states for n quibits" LANL preprint quant–ph/9804045 (Apr. 20, 1998).

N. Gissin & S. Popescu, "Quantum Info Defies Logic", Physical Review Focus, at http://focus.aps.org/v4/st3.html (Jul. 16, 1999). Accessed on Feb. 22, 2002.

A. Golub, "Andreev Reflections and Resonance Tunneling in Josephson Junctions", Phys. Rev. B, 52:10, 7458–7468 (Sep. 1, 1995).

A. Golubov and M. Yu. Kupriyanov "Anomalous proximity effect in d–wave superconductors", LANL preprint cond–mat/9803369 (1998).

A. Golubov and M. Yu, Kupriyanov, "Surface electronic scattering in d–wave superconductors", LANL preprint cond–mat/9901318 (1999).

G. Goppert, X. Wang, and H. Grabert, "High Temperature anomaly of the conductance of a tunnel junction", Phys. Rev. B, 55:16, R10213–R10216 (Apr. 15, 1997).

Daniel Gottesman, "Fault–Tolerant Quantum Computation with Higher–Dimensional Systems", LANL preprint quant–ph/9802007 (Feb. 2, 1998).

Daniel Gottesman, "A Theory of Fault–Tolerant Quantum Computation", LANL preprint quant–ph/9702029 (Feb. 17, 1997).

Daniel Gottesman, "Pasting quantum codes", LANL preprint quant–ph/9607027 (Jul. 31, 1996).

Daniel Gottesman, "A Class of Quantum Error–Correcting Codes Saturating the Quantum Hamming Bound", LANL preprint quant–ph/9604038 (Jul. 24, 1996).

H. Grabert, and G. Ingold, "Mesoscopic Josephson effect", Superlattices and Microstructures, 25:5/6, 915 (1999).

M.J Graf, S–K Yip et al., "Electronic thermal conductivity and the Wiedemann–Franz law for unconventional superconductors", Phys. Rev. B, 53:22, 15147–15161 (Jun. 1, 1996).

Markus Grassl, Martin Rotteler et al., "Computing Local Invariants of Qubit Systems" LANL preprint quant–ph/ 9712040 (May 29, 1998).

Markus Grassl, Thomas Beth, "Cyclic Quantum Error–Correcting Codes and Quantum Shift Registers", LANL preprint quant–ph/9910061 (1999).

M. Grassl and Th. Beth, "Codes for the Quantum Erasure Channel", LANL preprint quant–ph/9610042 (Jan. 17, 1997).

N. Groenbech–Jensen, P. S. Lomdahl, M. R. Samuelson, "Bifurcation and Chaos in a de–driven Long Annular Josephson Junction," Phys. Rev. B 43, 12799 (1991).

Lov K. Grover, "A fast quantum mechanical algorithm for database search", STOC, 212–219 (1996).

G. Hackenbroich, B. Rosenow, and H. Weidenmeuller, "Quantum Zeno effect and parametric resonance in mesoscopic physics", LANL preprint cond–mat/9807317 (Jul. 1998).

Michael J.W. Hall, "Random quantum correlations and density operator distributions" LANL preprint quant–ph/ 9802052 (Jul. 24, 1998).

U. Hanke, Yu. Galeperin, K. A. Chao, M. Gisselfält, M. Jonson, and R. I. Shekhter, "Static and dynamic transport in parity–sensitive systems", Phys. Rev. B 51, 9084–9095 (1995).

Yoshiko Hara, "Gains reported in quantum computing", E E Times, at http://www.eetimes.com/printableArticle?doc_id=OEG19990706S0030.com (Jul. 6, 1999).Accessed on Jul. 20, 1999.

Y. Harada, D. B. Haviland, P. Delsing, C. D. Chen, and T. Claeson, "Fabrication and measurement of a Nb based superconducting single electron transistor" Appl. Phys. Lett. 65, pp. 636–638 (1994).

T.F. Havel, S.S. Somaroo et al., "Principles and demonstrations of quantum information processing by NMR spectroscopy" LANL preprint quant–ph/9812086 (Jul. 3, 1999).

D. B. Haviland et al, "Measurement of a superconducting single electron transistor in a high impedance environment" *Physica* B 203, pp 347–353 (1994).

H. Hilgenkamp, J. Mannhart, and B. Mayer, "Implications of dx2–y2 symmetry and faceting for the transport properties of grain boundaries in high–Tc Superconductors", Phys. Rev. B 53, 14586–14593 (1996).

Scott Hill and William K. Wootters, "Entanglement of a Pair of Quantum Bits", LANL preprint quant–ph/9703041 (Mar. 23, 1997).

M. Hillery and V. Buzek, "Quantum copying: Fundamental inequalities", LANL preprint quant–ph/9701034 (Jan. 24, 1997).

Mika Hirvensalo, *Quantum Computing*, p. 26 (Springer, 2001).

J.J. Hogan–O'Neill, A.M. Martin et al., "Tilt grain–boundry effects in s– and d–wave superconductors", Phys. Rev. B, 60:5, 3568–3571 (Aug. 1, 1999).

Michal Horodecki, Ryszard Horodecki and Pawel Horodecki, "Optimal compression of quantum information for one–qubit source at incomplete data: a new aspect of Jaynes principle", LANL preprint Michal Horodecki, "Limits for compression of quantum information carried by ensembles of mixed states", LANL preprint quant–ph/9712035 (Dec. 17, 1997).

Michal Horodecki, "Limits for compression of quantum information carried by ensembles of mixed states", LANL preprint quant–ph/9712035 (Dec. 17, 1997).

Michael Horodecki, "Reduction criterion of separability and limits for a class of protocols of entanglement distillation", LANL preprint quant–ph/9708015 (Apr. 9, 1998).

U. Hubner, H. Schneidewind, F. Schmidl, P. Seidel, "Microlithography for High–Tc Superconductor Thin Film Technology", http://www.physik.uni–jena.de/~tief/ifk97/lithogr.html; accessed on Feb. 22, 2002.

A. Huck, A. van Otterlo, and M. Sigrist, "Time–reversal symmetry breaking and spontaneous currents in s–wave/normal–metal/d–wave superconductor Sandwiches", phys. Rev. B, 56:21, 14163–14167 (Dec. 1, 1997).

A.G. Huibers, S.R. Patel et al., "Distributions of the Conductance and its Parametric Derivatives in Quantum Dots", LANL preprint cond–mat/9801174 (Jan. 17, 1998).

M. Hurd, T. Lofwander, G. Johansson, and G. Wendin, "ac Josephson effect in d–wave junctions", Phys. Rev. B, 59:6, 4412–4426 (Feb. 1, 1999).

I. Iguchi and Z. Wen, "Experimental evidence for a d–wave pairing state in YBaCuO from a study of YBaCuO/insulator/Pb Josephson tunnel junctions", Physical Rev. B, 49:17, 12388–12391 (May 1, 1994).

E. Il'ichev, et al, "Anomalous Periodicity of the Current–Phase Relationship of Grain–Boundary Josephson Junctions in High–Tc Superconductors" LANL preprint cond–mat/9811017 (1998) [Later published as Phys. Rev. B 60, 3096 (1999)].

E. Il'ichev, V. Zakosarenko et al., "Nonsinusoidal Current–Phase Relationship of Grain Boundary Josephson Junctions in High–Tc Superconductors", Phys. Rev. Lett., 81:4, 894–897 (Jul. 27, 1998).

E. Il'ichev et al., "Temperature dependence of the current–phase relation for YBaCuO step–edge Josephson junctions", App. P. Lett., 72:6, 731–733 (Feb. 9, 1998).

E. Il'ichev, V. Zakosarenko et al., "Phase dependence of the Josephson current in inhomogeneous high–T grain–boundry junctions", Phys. Rev. B, 59:17, 11502–11505 (May 1, 1999).

Ambegaokar Vinay, Boldizsar Janko, "Parity Fluctuations between Coulomb Blockaded Superconducting Islands," Phys. Rev. Lett. 75:6, 1154–1157, (Aug. 7, 1995).

L. Ioffe, V. Geshkenbein, M. Feigel'man, A. Fauchere, and G. Blatter, "Quiet SDS' Josephson Junctions for Quantum Computing", LANL preprint cond–mat/9809116 (Jan. 11, 1999).

A. Jacobs and R. Kummel, "Proximity Effect, Andreev Reflections, and Charge Transport in Mesoscopic Superconducting–Semiconducting Heterostructures", LANL preprint cond–mat/9810343 (Nov. 3, 1998).

B. Janko and V. Ambegaoker, "Parity Fluctuations between Coulomb Blockaded Superconducting Islands", Phys. Rev. Lett. 75, pp. 1154–1157 (1995).

R. Colin Johnson, "Einselection' attempts to explain micro/macro worlds", E E Times, at http://www.eetimes.com/printableArticle?doc_id=OEG19990419S0043.com; Accessed on Apr. 19, 1999.

Jonathan A. Jones, Michele Mosca & Rasmus H. Hansen, "Implementation of a quantum search algorithm on a quantum computer", Lett. to Nature, 393, 344–346 (May 28, 1998).

P. Joyez et al., "Observation of Parity–Induced Suppression of Josephson Tunneling in the Superconducting Single Electron Transistor", Physical Review Letters, vol. 72:15, 2458–2461 (Apr. 11, 1994).

Richard Jozsa, Michal Horodecki et al., "Universal Quantum Information Compression", LANL preprint quant–ph/9805017 (May 7, 1998).

A. Kadigrobov, A. Zagoskin et al., "Giant conductance oscillations controlled by supercurrent flow through a ballistic mesoscopic conductor", Phys. Rev. B, 52:12, R8662–R8665– (Dec. 15, 1995).

A. Kadigrobov, A. Zagoskin, R. Shekhter, and M. Jonson, "Giant Conductance Oscillations in an Normal Mesoscopic Ring Induced by an SNS Josephson Current", LANL preprint cond–mat/9410080 (Oct. 21, 1994).

C. L. Kane, and Mathew P.A. Fisher, "Transmission through barriers and resonant tunneling in an interacting one–dimensional electron gas", Phys. Rev. B, 46:23, 15233–15262 (Dec. 15, 1992).

S. Kashiwaya, L. Alff, et al., "Tunneling spectroscopy and symmetries in YBCO and NCCO", [preprint; date unknown; hard copy].

S. Kashiwaya, Y. Tanaka, M. Koyanagi, S. Ueno, and K. Kajimura, "Quasiparticle tunneling in d/I/d junctions", Materials and Mechanisms of Superconductivity, High temperature Superconductors 5 (1997).

J. R. Kirtley, K. Moler, and D. J. Scalapino, "Spontaneous Flux and Magnetic Interference Patterns in 0–pi Josephson Junctions", LANL preprint cond–mat/9703067 (1997).

J.R. Kirtley et al., "Temperature Dependence of the Half–Integer Magnetic Flux Quantum", Science, 285, 1373–1375 (Aug. 27, 1999).

A. Yu. Kitaev, "Quantum measurements and the Abelian Stabilizer Problem", LANL preprint quart–ph/9511026 (Nov. 20, 1995).

T. Klapwijk, "Mesoscopic superconductor–semiconductor heterostructures", Physica B, 197, 481–499 (1994).

E. Knill, and R. Laflamme, and W. Zurek, Science, "Resilient Quantum Computation", Science, 279, 342, (Jan. 16, 1998).

E. Knill, "Non–binary Unitary Error Bases and Quantum Codes", LANL preprint quant–ph/9608048 (Oct. 8, 1996).

E. Knill and Raymond Laflamme, "Concatenated Quantum Codes", LANL preprint quant–ph/9608012 (Aug. 8, 1996).

E. Knill, "Bounds for Approximation in Total Variation Distance by Quantum Circuits", LANL preprint quant–ph/9508007 (Aug. 8, 1995).

E. Knill, "Approximation by Quantum Circuits", LANL preprint quant–ph/9508006 (Aug. 8, 1995).

E. Knill, R. Laflamme, R. Martinez, C. –H. Tseng, "A Cat–State Benchmark on a Seven Bit Quantum Computer", LANL preprint quant–ph/9908051 (1999).

E. Knill and R. Laflamme, "Theory of quantum error–correcting codes", Phys. Rev. A 55, pp. 900–911 (1997). [Also published as "A Theory of Quantum Error–Correcting Correcting Codes", LANL preprint quant–ph/9604034 (Apr. 26, 1996).].

Paolo Zanardi, Fausto Rossi, "Quantum Information in Semiconductors: Noiseless Encoding in a Quantum–Dot Array", LANL preprint quant–ph/9804016 (1998).

K. Kouzenotsov, A. Sun, et al. "C–axis Josephson Tunneling Between YBaCuO & Pb: Direct Evidence for Mixed Order Parameter Symmetry in a High–T Superconductor" LANL preprint cond–mat/9705283 (May 27, 1997).

S. E. Kubatkin , A. Ya. Tzalenchuk, Z. G. Ivanov, "Coulomb blockade electrometer with a high–Tc", JETP Lett. 63, pp. 126–132 (1996).

I. Kulik, "Macroscopic Quantization and the Proximity Effect in S–N–S Junctions", Sov. Phys. JETP, 30, 944 (1970).

I. Kulik, and R. Shekhter, "Kinetic phenomena and charge discreteness effects in granulated media", Sov. Phys.— JETP, 41, 308 (Feb. 1975).

I. Kulik, and Y. Mitsai, "Effect of impurities on the Josephson current through SNS junctions", Sov. J. Low Temp. Phys., 1:7, 434 (Jul. 1975).

S.G. Lachenmann, I. Friedrich et al., "Charge transport in superconductor/semiconductor/normal–conductor step juctions", Phys. Rev. B, 56:21, 14108–14115 (Dec. 1, 1997).

Raymond Laflamme, Cesar Miquel, Juan Pablo Paz et al., "Perfect Quantum Error Correction Code", LANL preprint quant–ph/9602019 (Feb. 27, 1996).

U. Ledermann, Alban L. Fauchere, and Gianni Blatter, "Nonlocality in Mesoscopic Josephson Junctions with Strip Geometry", LANL preprint cond–mat/9902134 v1 (Feb. 10, 1999).

A.J. Leggett, et al., "Dynamics of the dissipative two–state system", Rev. Mod. Phys. 59, pp. 1–85, (1987).

G. Lesovik, T. Martin, and J. Torres, "Josephson Frequency Singularity in the Noise of Normal Metal—Superconductor Junctions", LANL preprint cond–mat/9902278 (Jun. 25, 1999).

R. Liang, D. A. Bonn, and W. N. Hardy, "Growth on high quality YBCO single crystals using BaZrO 3 Crucibles", Physica C 304, 105–111 (1998).

D. A. Lidar, I. L. Chuang, K.B. Whaley, "Decoherence–Free Subspaces for Quantum Computation", Phys. Rev. Lett. 81, pp. 2594–2597 (1998).

N. Linden, S. Massar et al., "Purifying Noisy Entanglement Requires Collective Measurements", LANL preprint quant–ph/9805001 (May 1, 1998).

T. Loefwander, G. Johansson, M. Hurd. G. Wendin, "Superconducting d–wave junctions: The disappearance of the odd ac components", LANL preprint cond–mat/9710004 (1997).

Daniel Loss and David P. DiVincenzo, "Quantum Computation with Quantum Dots", LANL preprint cond–mat/9701055 (Jul. 20, 1997).

J. G. Lu, J. M. Hergenrother, and M. Tinkham, "Magnetic–field–induced crossover from 2e to e periodicity in the superconducting single–electron transistor", Phys. Rev. B 53, pp. 3543–3549 (1996).

A. Maassen van den Brink et al., "Combined Single–Electron and Coherent–Cooper–Pair Tunneling in Voltage–Based Josephson Junctions," Phys. Rev. Lett. 67 pp. 3030–3033 (1991).

Y. Makhlin, G. Schon, and A. Shnirman, "Josephson–junction qubits with controlled couplings", LANL preprint cond–mat/9808067 (Aug. 6, 1998).

Y. Makhlin, G. Shoen, and A. Shnirman, "Josephson–junction qubits with controlled couplings", Nature, 398, 305 (Mar. 1999).

Y. Makhlin, G. Schoen, and A. Schnirman, "Quantum computing & Josephson Junctions Circuits", p. 439 in *Quantum Mesoscopic Phenomena & Mesoscopic Devices in Microelectronics*, Kluwer, Dordrecht, The Netherlands (2000).

Alexander N. Korotkov & Mikko A. Paalanen, "Charge sensitivity of radio frequency single–electron transistor", App. Phy. Lett., 74:26, 4052–4054 (Jun. 28, 1999).

J. Mannhart et al, "Generation of Magnetic Flux by Single Grain Boundaries of $YBa_2Cu_3O_{7-x}$", Phys. Rev. Lett. 77, pp. 2782–2785 (1996).

A. Martin and C.J. Lambert, "Self–consistent current–voltage characteristics of superconducting nanostructures", Phys. Rev. B, 51:24, 17999–18002 (Jun. 15, 1995).

Leigh John Martinson, "What are Josephson Junctions? How do they work?", Scientific American, at http:www.sciam.com/askexpert/physics/physics37/physics37.html; Accessed on Feb. 22, 2002.

D. Maslov, and P. Goldbart, "Quasi–Andreev reflection in inhomogeneous Luttinger liquids", LANL preprint cond–mat/9711070 (Nov. 7, 1997).

D. Maslov, M. Stone, P. Goldbart, and D. Loss, "Josephson current and proximity effect in Luttinger liquids", Phys. Rev. B, 53:3, 1548–1557 (Jan. 15, 1996).

Masashige Matsumoto and Manfred Sigrist, "Quasiparticle States near the Surface and the Domain Wall in a px±ipy–Wave Superconductor", LANL preprint cond–mat/9902265 v2 (1999).

G. Massimo Palma, Kalle–Antii Suominen, Artur K. Ekert, "Quantum Computers and Dissipation", LANL preprint quant–ph9702001.

K. A. Matveev, M. Gisselfält, L. I. Glazman, and M. Jonson, "Parity–Induced Suppression of the Coulomb Blockade of Josephson Tunneling", Phys. Rev. Lett. 70 pp. 2940–2943 (1993).

Cesar Miquel, Juan Pablo Paz and Roberto Perazzo, "Factoring in a Dissipative Quantum Computer", LANL preprint quant–ph/9601021 (Jan. 23, 1996).

R. Colin Johnson, "Quantum dots are used to build logic gates", E E Times, at http://www.eetimes.com/printable/Article?doc_id=OEG19990428S0015.com; Accessed on Apr. 28, 1999.

K. Bottcher, and T. Kopp, "Multichannel do Josephson effect in ballistic point contacts", Phys. Rev. B., 55:17, 11670–11687 (May 1, 1997).

J. E. Mooij et al., "Josephson persistant–curent Qubit", Science, 285, 1036–1039, (Aug. 13, 1999).

A.F. Morpurgo, B.J. van Wees et al., "Energy Spectroscopy of Andreev Levels between Two Superconductors", Phys. Rev. Lett., 79:20, 4010–4013 (Nov. 17, 1997).

Michele Mosca, Artur Ekert, "The Hidden Subgroup Problem and Eigenvalue Estimation on a Quantum Computer", LANL preprint quant–ph/9903071 (1999).

Dima Mozyrsky, Vladimir Privman and Mark Hillery, "A Hamiltonian for Quantum Copying", LANL preprint quant–ph/9609018 (May 10, 1997).

Dima Mozyrsky and Vladimir Privman, "Quantum signal splitting that avoids initialization of the targets", LANL preprint quant–ph/9609010 (Aug. 31, 1997).

Y. Nakamura, A. N. Korotkov, C. D. Chen, and J. S. Tsai et al "Singularity–matching peaks in a superconducting single–electron transistor" Phys. Rev. B 56, pp. 5116–5119 (1997).

Y. Nakamura, Yu A. Pashin & J.S. Tsai, "Coherent control of macroscopic quantum states in a single–Cooper–pair box", Lett. to Nature, 398, 786–788 (Apr. 29, 1999).

S. Nicoletti et al., "Bi–epitaxial YBCO grain boundary Josephson Junctions on SrTiO3 and sapphire substrates", Physica C, 269, pp. 255–267, (1996).

M.A. Nielsen, "The entanglement fidelity and quantum error corection", LANL preprint quant–ph/9606012 (Jun. 13, 1996).

M. A. Nielsen, Isaac L. Chuang, "Programmable Quantum Gate Arrays", LANL Preprint quant–ph/9703032 (1997).

M. Nieto, "Quantized Phase Effect and Josephson Tunneling", Phys. Rev., 167:2, 416–417 (Mar. 10, 1968).

A.N. Omelyanchouk and Malek Zareyan, "Ballistic Four–Terminal Josephson Junction: Bistable States and Magnetic Flux Transfer", LANL preprint quant–ph/9905139 (May 11, 1999).

T.P. Orlando, J.E. Mooij et al., "Superconducting persistent–current qubit", Phys. Rev. B, 60:22, 15398–15413 (Dec. 1, 1999).

M. Oshikawa, and A. Zagoskin, "Voltage fluctuations on a superconductor grain attached to a quantum wire", LANL preprint cond–mat/9810303 (Jan. 1999).

S. Ostlund, "Landau Ginzburg theory of the d–wave Josephson junction", Phys. Rev. B, 58:22, R14757–R14758 (Dec. 1, 1998).

S. Panyukov, and A. Zaikin, "Coulomb Blockade and Non-perturbative Ground–State Properties of Ultrasmall Tunnel Junctions", Phys. Rev. Let., 67:22, 3168–3171 (Nov. 25, 1991).

Y. Pashkin, Y. Nakamura, and J. Tsai, "Metallic resistively coupled single–electron transistor", App. Phys. Lett., 74:1, 1323–134 (Jan. 4, 1999).

A. B. Pavolotsky, Th.Weimann, H. Scherer, V. A. Krupenin J. Niemeyer and A. B. Zorin, "Multilayer technique for fabricating Nb junction circuits exhibiting charging effects", J. Vac. Sci. Technol. B 17, pp. 230–232 (1999).

Asher Peres, "Error Correction and Symmetrization in Quantum Computers,", LANL preprint quant–ph/9611046 (Nov. 25, 1996).

Asher Peres, "Unitary Dynamics for Quantum Codewords", LANL preprint quant–ph/9609015 (Sep. 18, 1996).

P. Pingue et al. "Fabrication of hybrid superconductor—semiconductor nanostructures by integrated ultraviolet–atomic force microscope lithography", JVST B 15, pp. 1398–1401 (1997).

Martin B. Plenio and Peter L. Knight, "Decoherence limits to quantum computation using trapped ions", LANL preprint quant–ph/9610015 (Oct. 10, 1996).

M.B. Plenio and P.L. Knight, "Realistic lower bounds for the factorization time of large numbers on a quantum computer", LANL preprint quant–ph/9512001 (Dec. 2, 1995).

J.F. Poyatos, J.I. Cirac and P. Zoller, "Quantum gates with 'hot' trapped ions", LANL preprint quant–ph/9712012 (Dec. 4, 1997).

J.F. Poyatos, J.I. Cirac, P. Zoller, "Complete Characterization of a Quantum Process: the Two–Bit Quantum Gate", LANL preprint quant–ph/9611013 (Nov. 10, 1996).

John Preskill, "Reliable Quantum Computers", LANL preprint quant–ph/9705031 (Aug. 26, 1997).

Eric M. Rains, "Quantum Codes on Minimum Distance Two", LANL preprint quant–ph/9704043 (Apr. 24, 1997).

Eric M. Rains, R.H. Hardin et al., "A Nonadditive Quantum Code", LANL preprint quant–ph/9703002 (May 9, 1997).

John H. Reina, Luis Ourioga, Neil F. Johnson, "Decoherence of Quantum Registers", LANL preprint quant–ph/0105029 (2001).

R. Rouse et al., "Observation of Resonant Tunneling between Macroscopically Distinct Quantum Levels" Phys. Rev. Lett. 75, pp. 1614–1617 (1995).

Rudiger Schack, "Using a quantum computer to investigate quantum chaos", LANL preprint quant–ph/9705016 (May 10, 1997).

S. Schneider, H. M. Wiseman, W. J. Munro, G. J. Milburn, "Measurement and State Preparation via Ion Trap Quantum Computing", LANL preprint quant–ph/9709042 (1999).

R.J. Schoelkopf, P. Wahlgren et al., "The Radio–Frequency Single–Electron Transistor (RF–SET): A Fast and Ultrasensitive Electrometer", Science, 280, 1238–1242, (May 22, 1998).

H. Schoeller et al, "Resonant tunneling and charge fluctuations in mesoscopic tunnel junctions" *Physica* B 201, pp. 423–431 (1994).

Gerd Schön A.D. Zaikin, "Quantum Coherent Effects, Phase Transitions, and the Dissipative Dynamics of Ultra Small Tunnel Junctions", Physics Reports, 198:5/6, 237–412 (1990).

Gerd Schön et al., "Parity effects in superconducting SET transistors", Physica B 203, pp 340–346 (1994).

Gerd Schön, Alexander Shnirman, and Yuriy Makhlin, "Josephson–Junction Qubits and the 1998 Readout Process by Single–Electron Transistors", LANL preprint cond–mat/9811029v1 (Nov. 3, 1998).

Leonard J. Schulman and Umesh Vazirani, "Scalable NMR Quantum Computation", LANL preprint quant–ph/9804060 (Apr. 24, 1998).

S. Sergeenkov, "Probing mixed s ± id pairing state via thermoelectric response of SND junction", LANL preprint cond–mat/9805389 (May 29, 1998).

R. Seviour, C.J. Lambert, and M. Leadbeater, "Large–scale superconductivity–induced conductance suppression in mesoscopic normal–superconducting structures", LANL preprint cond–mat/9712166 (Dec. 15, 1997).

A. Shnirman, and G. Shoen, "Quantum measurements performed with a single–electron transistor", Phys. Rev. B, 57:24, 15400–15407 (Jun. 15, 1998).

Peter Shor, "Polynomial–time Algorithms for Prime Factorization and Discrete Logarithms on a Quantum Computer", SIAM Journal of Comput., 26:5, 1484–1509 (1997).

P.W. Shor, "Quantum Error–Correcting Codes Need Not Completely Reveal the Error Syndrome", LANL preprint quant–ph/9604006 (Apr. 12, 1996).

J.A. Sidles, "The AC Stark, Stern–Gerlach, and Quantum Zeno Effects in Interferometric Qubit Readout", LANL preprint quant–ph/9612001 (Nov. 28, 1996).

M. Sigrist, D.B. Bailey and R.B. Laughlin, "Fractional Vortices as Evidence of Time–Reversal Symmetry Breaking in High–Temperature Superconductors", Phys. Rev. Lett., 74:16, 3249–3252 (Apr. 17, 1995).

A.M. Steane, "Space, time, parallelism and noise requirements for reliable quantum computing", LANL preprint quant–ph/9708021 (Aug. 12, 1997).

A .M. Steane, "Simple Quantum Error Correcting Codes", LANL preprint quant–ph/9605021 (May 15, 1996).

Andrew Steane, "Multiple Particle Interference and Quantum Error Correction", LANL preprint quant–ph/9601029 (May 13, 1996).

Y. Takane, and Y. Koyama, "Superconducting Proximity Effect on a One–Dimensional Interacting Electron Gas", J. Phys. Soc. Jpn., 65:11, 3630–3637 (Nov. 1996).

Y. Tanaka, "Josephson Effect between s Wave and $d_{x^2-y^2}$ Wave Superconductors", Phys. Rev. Lett., 72:24, 3871–3874 (Jun. 13, 1994).

Y. Tanaka, and S. Kashiwaya, "Influences of broken time–reversal symmetry on the dc Josephson effects in d–wave superconductors", Phys. Rev. B, 58:6, R2948–R2951 (Aug. 1, 1998).

Y. Tanaka and S. Kashiwaya, "Theory of d.c. Josephson current in d–wave superconductor/ normal metal / d–wave superconductor junctions", Materials and Mechanisms of Superconductivity, High temperature Superconductors 5 (1997).

Y. Tanaka, and S. Kashiwaya, "Theory of Josephson effects in anisotropic superconductors", Phys. Rev. B, 56:2, 892–912 (Jul. 1, 1997).

Y. Tanaka and Satoshi Kashiwaya, "Theory of the Josephson effect in d–wave superconductors", Phys. Rev. B, 53:18, 11957–11960 (1998).

Y. Tanuma, Y. Tanaka, M. Yamashiro, and S. Kashiwaya, "Theory of Local Density of States in d–wave Superconductors around rough surfaces", Proceedings of the 9th International Symposium on Superconductivity, Springer–Verlag (1997).

Gary Taubes, "Is the third time a charm for a superconducting computer?", Science, 261:5129, 1670 (Sep. 24, 1993).

T. Terashima, K. Shimura et al., "Superconductivity of One–Unit–Thick YBaCuO Thin Film", Phys. Revw. Lett., 67:10, 1362–1365 (Sep. 2, 1991).

M. Tinkham, Introduction to Superconductivity, pp. 264–286, ($2^{nd}$ ed., McGraw–Hill, 1996).

Paivi Torma and Stig Stenholm, "Polarization in Quantum Computations", LANL preprint quant–ph/9602021 (Feb. 29, 1996).

C.C. Tsuei, J.R. Kirtley et al., "Pairing Symmetry and Flux Quantization in a Tricrystal Superconducting Ring of YBaCuO", Phys. Rev. Lett., 73:4, 593–596 (Jul. 25, 1994).

C. C. Tsuei, J. R. Kirtley, M. Rupp et al., "Pairing Symmetry in Single–Layer Tetragonal Tl2Ba2CuO6.s superconductors.Cover Story", Science, 271:5247, 329 (Jan. 19, 1996).

Robert Tucci, "How to Compile A Quantum Bayesian Net", LANL preprint quant–ph/9805016 (May 7, 1998).

Robert Tucci, "A Rudimentary Quantum Compiler", LANL preprint quant–ph/9805015 (May 7, 1998).

W.G. Unruh,"Maintaining coherence in Quantum Computers", LANL preprint hep–th/9406058 (Jun. 9, 1994).

B. van Wees, K. Lenssen, and C. Harmans, "Transmission formalism for supercurrent flow in multiprobe superconductor–semiconductor–superconductor devices", Phys. Rev. B, 44:1, 470–473 (Jul. 1, 1991).

F. Vatan, V.P. Roychowdhury et al., "Spatially Correlated Qubit Errors and Burst–Correcting Quantum Codes", LANL preprint quant–ph/9704019 (May 16, 1997).

D. Vitali and P. Tombesi, "Decoherence control for optical qubits", LANL preprint quant–ph/9802033 (Feb. 12, 1998).

Alexander Yu. Vlasov, "Quantum Computations and Images Recognition", LANL preprint quant–ph/9703010 (Mar. 7, 1997).

A.F. Volkov and R. Seviour, "Phase–coherent effects in multiterminal superconductor/normal metal mesoscopic structures", LANL preprintcond–mat/0003370 (Mar. 26, 2000).

G. Volovik, "Comment on Magnus Force in Superfluids in superconductors", LANL preprint cond–mat/9707136 (Jul. 1997).

Haiging Wei, Xin Xue, "Tailoring Many–Body Interactions to Solve Hard Combinatorial Problems", LANL preprint quant–ph/9702039 (1997).

U. Weiss, R. Egger, and M. Sassetti, "Low–temperature nonequilibrium transport in a Luttinger liquid", LANL preprint cond–mat/9509150 (Sep. 25, 1995).

G. Wendin, V. S. Shumeiko, and P. Samuelsson, "Controlling Josephson transport by manipulation of Andreev levels in ballistic mesoscopic junctions", LANL preprint cond––mat/ 9812092 (1998).

D.J. Wineland, C. Monroe, D.M. Meekhof et al., "Quantum State Manipulation of Trapped Atomic Ions", LANL preprint quant–ph/9705022.

D.A. Wollman, D.J. Van Harlingen et al., "Evidence for $d_{x^2-y^2}$ Pairing from the Magnetic Field Modulation of $YBa_2Cu_3$–Pb Josephson Junction", Phys. Rev. Lett., 74:5, 797–800 ( Jan. 30, 1995).

William K. Wootters, "Entanglement of Formation of an Arbitrary State of Two Qubits", LANL preprint quant–ph/ 9709029 (Sep. 13, 1997).

A. Levy Yeyati, A. Martin–Rodero and J.C. Cuevas, "The phase–dependant linear conductance of a superconducting quantum point contact", LANL preprint cond–mat/9505102 v1, May 23, 1995.

S. Yip, "Josephson current–phase relationships with unconventional superconductors", Phys. Rev. B., 52:5, 3087–3090(Aug. 1, 1995).

S Yip, and J. Sauls, "Nonlinear Meissner Effect in CuO Superconductors", Phys. Rev. Lett., 69:15, 2264–2267 (Oct. 12, 1992).

A. M. Zagoskin, "Magnetic Interference Pattern in a Clean s–wave–Normal Metal–d–wave Superconductor Junction", Phys. Stat. Sol. (b) 202 p. R9 (1997).

A. Zagoskin, "The half–periodic Josephson effect in an s–wave superconductor–normal metal–d–wave superconductor juction", J. Phys.: Condens. Matter, 9, L419 (1997).

A. Zagoskin, and I. Affleck, "Fermi edge singularities: Bound states and finite–size effects", J. Phys. A: Math. Gen., 30, 5743–5765 (1997).

A. Zagoskin, and M. Oshikawa, "Spontaneous magnetic flux and quantum noise in an annular mesoscopic SND junction", J. Phy.: Condens. Matt., 10, L105 (1998).

A. Zagoskin, "Quantum Theory of Many–Body Processes", pp. 19–20, 203, (Springer, New York, 1998).

Alexandre M. Zagoskin & Masaki Oshikawa, "Spontaneous Magnetic Flux and Quantum Noise in a Doubly Connected Mesoscopic SND Junction", LANL preprint cond–mat/ 9710260 (Oct. 23, 1997).

Alexandre M. Zagoskin, "A scalable, tunable qubit, based on clean DND or grain boundary D–D junction", LANL preprint cond–mat/ 9903170 (1999).

Christof Zalka, "Threshold Estimate for Fault Tolerant Quantum Computing", LANL preprint quant–ph/9612028 (Jul. 28, 1997).

P. Zanardi, "Dissipative Dynamics in a Quantum Register", LANL preprint quant–ph/9708042 (Aug. 25, 1997).

P. Zanardi, M. Rasseti, "Noiseless Quantum Codes", LANL preprint quant–ph/9705044 (1997).

Paolo Zanardi, "Dissipation and Decoherence in a Quantum Register", LANL preprint quant–ph/9705045 (Feb. 6, 1998).

Paolo Zanardi, Fausto Rossi, "Subdecoherent Information Encoding in a Quantum–Dot Array", LANL preprint quant–ph/9808036 (1998).

Kuan Zhang, D.A. Bonn et al., "Measurement of the ab Plane Anistropy of Microwave Surface Impedance of Untwinned YBaCuO Single Crystals", Phys. Rev. Lett., vol. 73:18, 2484–2487 (Oct. 31, 1994).

M. Zhitomirsky and M. Walker, "Electronic States on a Twin Boundary of a d–Wave Superconductor", LANL preprint cond–mat/9705202 (May 20, 1997).

Jian–Xin Zhu, Z. Wang, and H. Tang, "Bound states and Josephson current in mesoscopic s–wave superconductor–normal metal–d–wave superconductor junctions", Phys. Rev. B, 54:10, 7354–7359 (Sep. 1, 1996).

Jian–Xin Zhu and C.S. Ting, "Spontaneous flux in a d–wave superconductor with time–reversal–symmetry–broken pairing state at {110}–oriented boundaries", Phys. Revw. B, 60:6, R3739–R3742 (Aug. 1, 1999).

Wojciech Hubert Zurek and Raymond Laflamme, "Quantum Logical Operations on Encode Qubits", LANL preprint quant–ph/9605013 (May 14, 1996).

Makhlin, et al., "Josephson–Junction Qubits and the Read-out Process by Single–Electron Transistors," arXiv:cond–mat/9811029v2 (Dec. 2, 1999).

* cited by examiner

QUANTUM COMPUTING METHOD USING MAGNETIC FLUX STATES AT A JOSEPHSON JUNCTION

CROSS-REFERENCE TO RELATED PATENT APPLICATION

This is a divisional of U.S. pat. app. Ser. No. 09/452,749, filed on Dec. 1, 1999.

BACKGROUND

1. Field of the Invention

This invention relates to quantum computing and to solid state devices that use superconducting materials to create and maintain coherent quantum states such as required for quantum computing.

2. Description of Related Art

Research on what is now called quantum computing traces back to Richard Feynman, [R. Feynman, Int. J. Theor. Phys., 21, 467–488 (1982)]. Feynman noted that quantum systems are inherently difficult to simulate with conventional computers but that observing the evolution of a quantum system could provide a much faster way to solve the same computational problems. In particular, solving a theory for the behavior of a quantum system commonly involves solving a differential equation related to the Hamiltonian of the quantum system. Observing the behavior of the quantum system provides information regarding the solutions to the equation.

Further efforts in quantum computing were initially concentrated on "software development" or building of the formal theory of quantum computing. Software for quantum computing attempts to set the Hamiltonian of a quantum system to correspond to a problem requiring solution. Milestones in these efforts were the discoveries of the Shor and Grover algorithms. [See P. Shor, SIAM J. of Comput., 26:5, 1484–1509 (1997); L. Grover, Proc. 28th STOC, 212–219 (1996); and A. Kitaev, LANL preprint quant-ph/9511026 (1995)]. In particular, the Shor algorithm permits a quantum computer to factorize natural numbers. The showing that fault-tolerant quantum computation is theoretically possible opened the way for attempts at practical realizations of quantum computers. [See E. Knill, R. Laflamme, and W. Zurek, Science, 279, p. 342 (1998).]

One proposed application of a quantum computer is factoring of large numbers. In such an application, a quantum computer could render obsolete all existing encryption schemes that use the "public key" method. In another application, quantum computers (or even a smaller scale device, a quantum repeater) could allow absolutely safe communication channels, where a message, in principle, cannot be intercepted without being destroyed in the process. [See H. J. Briegel et al., LANL preprint quant-ph/9803056 (1998) and the references therein.]

Quantum computing generally involves initializing the states of N qubits (quantum bits), creating controlled entanglements among the N qubits, allowing the quantum states of the qubits to evolve under the influence of the entanglements, and reading the qubits after they have evolved. A qubit is conventionally a system having two degenerate quantum states, and the initial state of the qubit typically has non-zero probabilities of being found in either degenerate state. Thus, N qubits define an initial state that is a combination of $2^N$ degenerate states. The entanglements control the evolution of the distinguishable quantum states and define calculations that the evolution of the quantum states perform. This evolution, in effect, performs $2^N$ simultaneous calculations. Reading the qubits after evolution is complete determines the states of the qubits and the results of the calculations.

Several physical systems have been proposed for the qubits in a quantum computer. One system uses chemicals having degenerate spin states. Nuclear magnetic resonance (NMR) techniques can read the spin states. These systems have successfully implemented the Shor algorithm for factoring of a natural number (15). However, efforts to expand such systems up to a commercially useful number of qubits face difficult challenges.

Another physical system for implementing a qubit includes a superconducting reservoir, a superconducting island, and a dirty Josephson junction that can transmit a Cooper pair (of electrons) from the reservoir into the island. The island has two degenerate states. One state is electrically neutral, but the other state has an extra Cooper pair on the island. A problem with this system is that the charge of the island in the state having the extra Cooper pair causes long range electric interactions that interfere with the coherence of the state of the qubit. The electric interactions can force the island into a state that definitely has or lacks an extra Cooper pair. Accordingly, the electric interactions can end the evolution of the state before calculations are complete or qubits are read. This phenomenon is commonly referred to as collapsing the wavefunction, loss of coherence, or decoherence.

Research is continuing and seeking a structure that implements a quantum computer having a sufficient number of qubits to perform useful calculations.

SUMMARY

In accordance with the invention, a qubit includes a superconducting island that a Josephson junction separates from a superconducting bank. The island has a crystal orientation that differs from the crystal orientation of the reservoir, and a grain boundary between the island and reservoir forms a clean (ballistic) Josephson junction. One or both of the island and the bank are D-wave superconductors so that a ground state current flows at the Josephson junction. The ground state of the supercurrent at the Josephson junction is twice degenerate with the magnetic moment produced by the supercurrent distinguishing the two states. The crystal orientation of the island relative to the bank controls the equilibrium phase difference in the order parameter across the junction and therefore the tunneling probabilities between the ground states.

To read the supercurrent state associated with the island, a single electron transistor (SET) or parity key can connect the island to ground. When the SET is biased to conduct, the current through the SET collapses supercurrent state to a state with fixed magnetic moment and fixes the supercurrent in that state. Thus, upon completion of a calculation, a control circuit biases the SET to conduct, and the magnetic moment at the Josephson junction is fixed in a particular state and can be dependably read.

To form a quantum register, multiple Josephson junctions can couple respective superconducting islands to a superconducting bank, and a current through the bank can initialize the quantum states of the supercurrents at the junctions. Single electron transistors (SETs) or parity keys interconnect the islands to create controlled entanglements as required for quantum computing. After completion of the computing, other SETs or parity keys connect the islands to ground and freeze the supercurrents at the Josephson junctions into states having definite magnetic moments. This freezing maintains the states for subsequent read operations that measure the local magnetic moments or magnetic flux.

One embodiment of the invention is a quantum computing structure such as a quantum coherer or a quantum register that includes a bank of a superconducting material and an island of a superconducting material, wherein at least one of the island and the bank is a d-wave superconductor. The normal-conductor portion of a clean Josephson junction can be, for example, a grain boundary between the bank and the island. Optionally, a single electron transistor (SET) or a parity key is between the island and ground. The orientation of the supercurrent through the junction is fixed when the SET is conductive and can evolve when the SET is non-conductive. As another option, the structure also includes a second bank of superconducting material, and a Josephson junction between the first and second banks. Operation of a SET between the second bank and the island selectively initializes the supercurrent's quantum state according to the phase of the order parameter in the first or second bank.

Another embodiment of the invention is a quantum register that includes: a bank of a superconducting material; a plurality of islands of superconducting material; and a plurality of clean Josephson junctions. Each clean Josephson junction is between the bank and a corresponding one of the islands. One or both of the island and the bank include a d-wave superconductor. The quantum register optionally includes three sets of SETs. Each SET in a first set is between ground and a corresponding one of the islands. Each SET in the second set is between a corresponding pair of the islands. Each SET in the third set is between a second bank and a corresponding one of the islands. The Josephson junction creates an order parameter phase difference between the first and second banks. The second bank and the third set of SETs can be used for selective initialization of supercurrents at the junctions according to the phase of the second bank.

In accordance with another embodiment of the invention, a quantum computing method cools a structure including a bank and an island to a temperature that makes the bank and the island superconducting and suppresses the decoherence processes in the system. The structure includes a junction that is a clean Josephson junction between the island and the bank. After the structure is at the appropriate temperature, the method establishes a supercurrent at the junction in a quantum state that is an admixture of a first state having a first magnetic moment and a second state having a second magnetic moment. The supercurrent at the junction is a ground state current arising from use of a d-wave superconductor in the structure and can be set by running a current through the bank. The quantum state evolves according to probabilities for tunneling between the first and second ground states. The evolution performs the quantum computing. Determining a measured magnetic moment or flux due to the supercurrent at the junction determines a result from the quantum computing.

In accordance with another aspect of the invention, determining the measured magnetic moment includes: grounding the island to fix the supercurrent in the first or second state; and measuring the magnetic flux produced by the supercurrent while the island is grounded.

Typically, the quantum register further includes a plurality of islands and a plurality of junctions, each junction being a clean Josephson junction between the bank and a corresponding island. The quantum states of the supercurrents at the junctions evolve according to the conductivities of transistors that couple islands together. These transistors create entanglements of the quantum states of the islands. The manufacturer of the quantum register can select for each island, a crystal orientation according to the initial quantum state desired for the island.

BRIEF DESCRIPTION OF THE DRAWINGS

Use of the same reference symbols in different figures indicates similar or identical items.

DETAILED DESCRIPTION

In accordance with an aspect of the invention, quantum computing uses qubits based on the degenerate ground states of the supercurrent at a DD, DND, or SND Josephson junction. The Josephson junctions can be fabricated in useful numbers in a solid state structure. With a d-wave superconductor on at least one side of the Josephson junction, the Josephson junction has non-zero ground state supercurrent in the vicinity of the junction. This ground state supercurrent is either clockwise or counterclockwise in the preferred (so called ab-) plane of the d-wave superconductor. The ground-state supercurrent in the vicinity of each Josephson junction is thus doubly degenerate and provides the basis for a quantum coherer or a qubit for quantum computing in accordance with an embodiment of the invention.

Figure 1A:
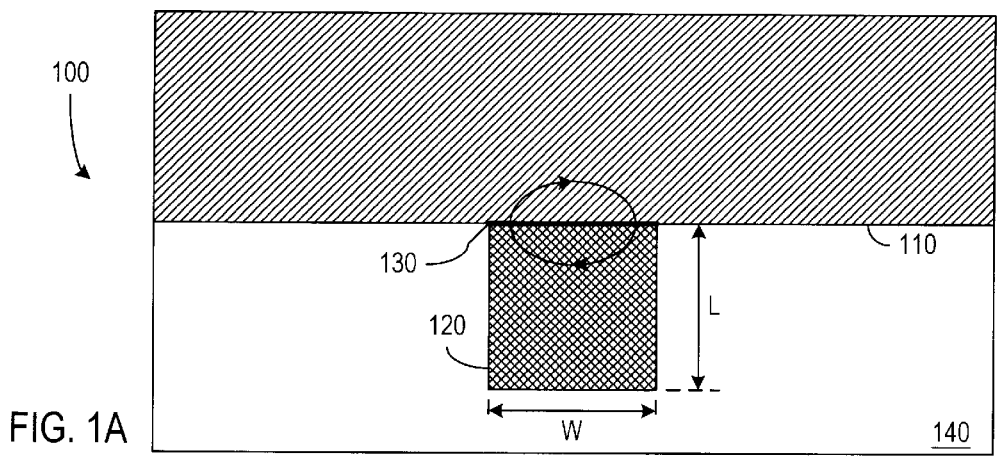
FIGS. 1A, 1B, and 1C are plan views of quantum coherer having a horizontal architecture in accordance with an embodiment of the invention.

FIG. 1A is a plan view of horizontal quantum coherers 100 in accordance with exemplary embodiments of the invention. Quantum coherer 100 provides a basic block for construction of a qubit but can also be an independent device allowing demonstration of macroscopic quantum tunneling and incoherent quantum noise in a solid state system. As described further below, the macroscopic quantum tunneling in a set of independent quantum coherers permits construction of a random number generator that generates random series with zero correlation.

Quantum coherer 100 includes a Josephson junction 130 between a larger superconducting bank 110 and a mesoscopic, superconducting island 120 formed on an insulating substrate 140. At least one of bank 110 and island 120 is a d-wave superconductor, for example, a high-Tc cuprate such as $YBa_2Cu_3O_{7-x}$ or any superconductor, in which the Cooper pairs are in a state with non-zero orbital angular momentum. In a first exemplary embodiment of the invention, both bank 110 and island 120 are made of d-wave superconductor. In this embodiment, junction 130 is clean in that the junction is conducting (e.g., a normal conducting layer or a grain boundary) and lacks scattering sites. As described further below, a grain boundary between a d-wave superconductor bank 110 and a d-wave superconductor island 120 can create a Josephson junction 130.

In a second exemplary embodiment, bank 110 is an s-wave superconducting material such as Niobium (Nb), and island 120 is a d-wave superconductor. In a third embodiment, bank 110 is a d-wave superconducting material, and island 120 is an swave superconductor. For the second and third embodiments, junction 130 includes a normal conductor between bank 110 and island 120. The normal conductor can be any conductive material that forms a good contact with both the d-wave and s-wave superconductors, has a large elastic scattering length, and remains a normal conductor at the operating temperature of quantum coherer 100 (typically between about 10° K and about 1° K). In particular, gold (Au) is a suitable normal conductor for junction 130.

In the exemplary embodiments, bank 110 is a chip of superconducting material about 1 µm or more in length and width. The thickness of bank 110 is not critical but generally should not exceed that of the mesoscopic island 120. Island 120 is mesoscopic (i.e., has a size such that a single excess Cooper pair is noticeable) and typically has a width W about 0.2 µm or less, a length L about 0.5 µm or less, and thickness about 0.2 µm or less.

Quantum coherer 100 can be formed using conventional techniques. In the first exemplary embodiment where both bank 110 and island 120 are d-wave superconductors, substrate 140 is a bi-crystal substrate such as a strontium-titanate bi-crystal substrate available from KagakuGijutsu-sha of Tokyo, Japan. The fabrication process begins by growing a film of a high-Tc cuprate having a thickness of about 0.2 microns on substrate 140. Regions of the high-Tc cuprate film inherit different crystal orientation from underlying substrate 140, and a grain boundary forms between the two different regions. Such a film can be grown using pulsed laser deposition, which uses a laser beam to sputter the high-Tc cuprate onto substrate 140. A photolithographic process then masks and etches the film to form island 120 (typically as one of several islands) adjacent bank 110. For islands 120 of the small size desired, the etching or patterning process can use an electron beam to remove part of the wave superconductor and leave island 120 with the desired dimensions. Il'ichev et al., cond-mat/9811017, p.2 describes known fabrication technique using high-Tc cuprates and is hereby incorporated by reference in its entirety.

In the second and third embodiments where one of bank 110 or island 120 is an s-wave superconductor, the fabrication process starts by depositing a film of d-wave superconductor on substrate 140. The film is etched (if necessary) to limit the boundaries of the d-wave superconductor to the desired boundaries of bank 110 or island 120. Alternatively, bank 110 or island 120 can be etched from a bulk d-wave film. A normal conductor such as gold is deposited and patterned to leave material for junctions 130. Finally, a film of s-wave superconductor is deposited and patterned (if necessary) to limit the boundaries of the s-wave superconductor for bank 110 or island 120.

For operation, quantum coherer 100 is cooled to a temperature less than about 10° K so that bank 110 and island 120 are superconducting and Josephson junction 130 is operative. The operating temperature of quantum coherer 100 is far below the threshold temperature for superconductivity of the d-wave superconductor to suppress thermal sources of decoherence. In particular, the low temperature suppresses decoherence processes due to inelastic scattering. If quantum coherer 100 contains an s-wave superconductor, the operating temperature is below the transition temperature of the s-wave superconductor (e.g., below 9.25° K for pure Nb).

At junction 130, the d-wave superconductor causes a non-zero supercurrent in the ground state, and the ground state of the supercurrent is twice degenerate if no external electromagnetic field is applied. Two degenerate states having the ground state energy and definite magnetic moment correspond to minimal supercurrents circulating through Josephson junction 130 in clockwise and counter-clockwise senses, in a preferred plane of the crystal structures of bank 110 and/or island 120. In accordance with current theoretical descriptions, e.g., the Ginzburg-Landau theory, of superconductivity, an order parameter $\Psi$ describes supercurrents in superconductors, and a phase difference $\Delta\phi$ in the order parameter when crossing junction 130 indicates the state or direction of the supercurrent. The two states associated with the supercurrent in island 120 permit quantum computing as described further below.

Quantum coherer 100 operates at a temperature below about 10° K so that bank 110 and island 120 are superconducting and thermal excitations do not interfere with the coherence of the quantum state associated with the supercurrent in island 120. An external circuit (not shown) can generate an electric field that causes a current through bank 110 to the right or left that initializes quantum coherer 100 to a quantum state corresponding to a known superposition of the clockwise and counterclockwise supercurrent states at junction 130. Alternatively, temporary application of a magnetic field can also initialize the state of island 120 by temporarily breaking the degeneracy in the two ground state energies. Subsequent quantum tunneling between the ground states causes the state of island 120 to evolve.

In the first exemplary, island 120 is a d-wave superconductor with a crystal orientation that differs from that of bank 130. Since the Josephson junction is a clean junction, the difference in crystal orientation is a primary factor in determining the magnitude of the equilibrium phase difference $\Delta\phi$ in the order parameter $\Psi$ at the junction, and the magnitude of the phase difference $\Delta\phi$ is not restricted to $\pi/2$ as typically would be the case with a tunneling junction. (The two degenerate states of the junction respectively correspond to positive and negative phase differences $\Delta\phi$.) Accordingly, the choice of lattice mismatch between bank 110 and island 120 selects the phase difference $\Delta\phi$. This permits selection of tunneling rates between the ground states within an exponentially wide range.

Another advantage of having a clean junction is a difference in crystal orientations (or $\Delta\phi$) can restrict the ground states to having a low probability of being in states having excess charge on island 120. Thus, the state of island 120 has weaker electrostatic interactions with the surroundings. This reduces or eliminates a source of decoherence in the state of island 120, and the state of island 120 can continue to evolve for a relatively long period without collapsing the wavefunction. The spontaneous supercurrent at Josephson junction 130 creates spontaneous magnetization, and the direction of the current and the magnetization distinguish the working quantum states of quantum coherer 100. However, the magnetic reactions with the surroundings are weak enough to avoid significant problems with decoherence.

Figure 1B:
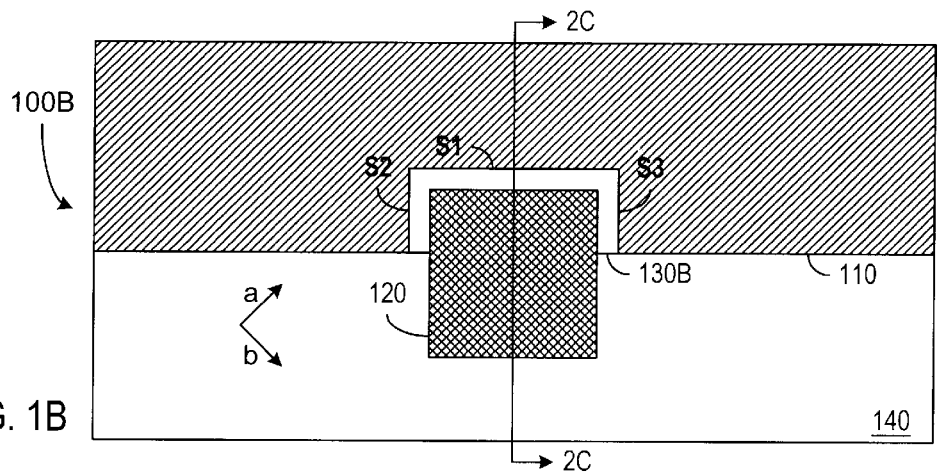

The geometry or architecture of Josephson junction 130 in quantum coherer 100 can be varied in variety of ways that facilitate selection of the phase difference $\Delta\phi$ in the superconducting order parameter. FIG. 1B is a plan view of a quantum coherer 100B according to another embodiment of the invention. Quantum coherer 100B includes a Josephson junction 130B that separates bank 110 from mesoscopic island 120. Josephson junction 130B is particularly suited for the embodiments of the invention where one of bank 110 and island 120 is an s-wave superconductor and the other one of bank 110 and island 120 is a d-wave superconductor. Bank 110, island 120, and junction 130B are respectively formed in the same manner described above for bank 110, island 120, and junction 130 of FIG. 1A.

Quantum coherer 100B differs from quantum coherer 100 in crystal orientation of island 120 relative to bank 110 across junction 130B. The a-b plane of the d-wave superconductor lies in the plane of FIG. 1B. In coherer 100B, junction 130B has three regions S1, S2, and S3 where the relative crystal orientation of bank 110 and island 120 across region S1 differs from the relative crystal orientation across regions S2 and S3. The lengths of regions S1, S2, and S3 can be changed to adjust the equilibrium phase difference in the superconducting order parameter across junction 213 and the magnitude of the magnetic flux of the ground state supercurrent.

Figure 1C:
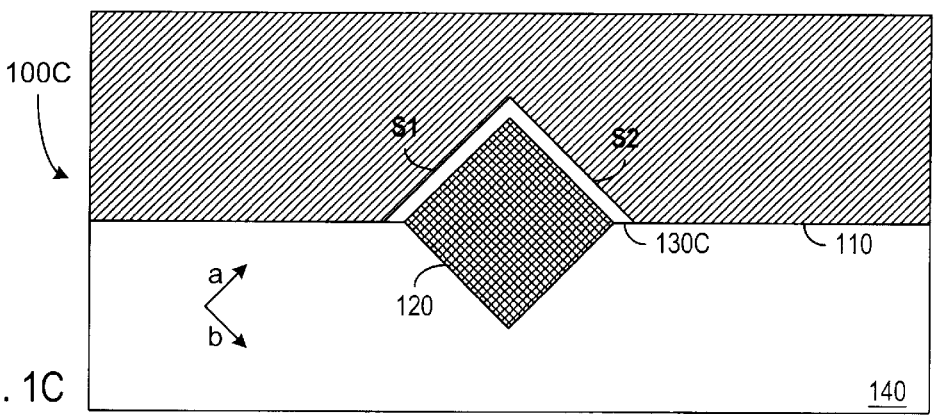

FIG. 1C shows a plan view of another horizontal quantum coherer 100C in which a Josephson junction 130C has two regions S1 and S2 with different crystal orientations across the regions S1 and S2. As in coherer 100B, changing the orientation of island 120 and the lengths of regions S1 and S2 can adjust the phase difference in the superconducting order parameter between bank 110 and island 120.

Figure 2A:
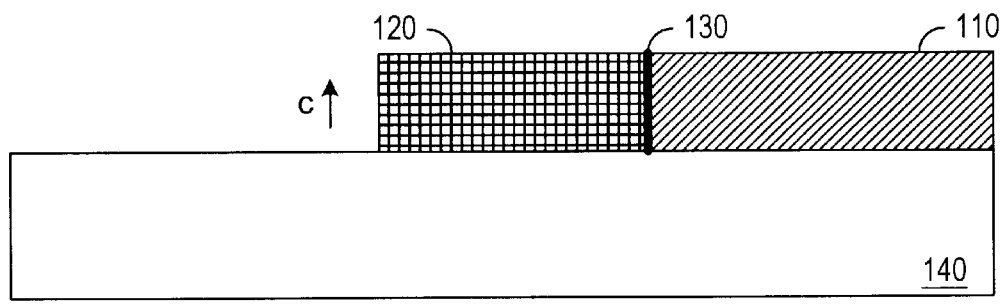
FIGS. 2A, 2B, and 2C are cross-sectional views of horizontal quantum coherers that in accordance with embodiments of the invention.
Figure 2B:
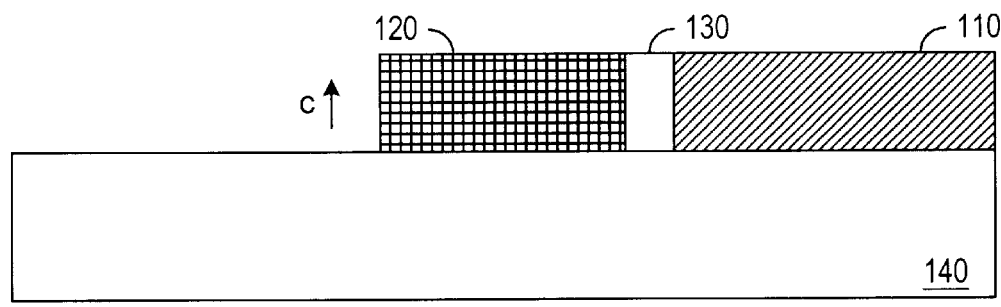

The cross-section of the junction 130 also has several alternative configurations. FIG. 2A shows a cross-sectional view of a horizontal quantum coherer where both bank 110 and island 120 are d-wave superconductors and a grain boundary forms Josephson junction 130. FIG. 2B shows a cross-sectional view of a horizontal quantum coherer where a normal conductor between bank 110 and island 120 forms Josephson junction 130. The normal conductor is suitable when both bank 110 and island 120 are d-wave superconductors or when one of bank 110 and island 120 is an s-wave superconductor.

Figure 2C:
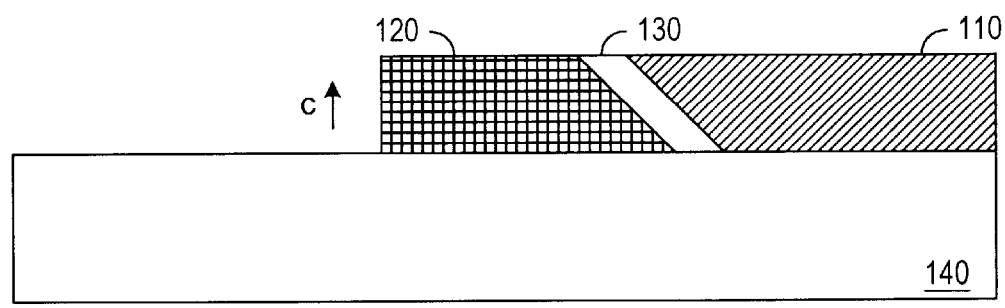

FIG. 2C illustrates that surface of the Josephson junction 130 is not required to be perpendicular to the preferred plane (the ab-plane) of the supercurrent in the d-wave superconductor. Current techniques for growing a high-Tc superconductor on insulating substrate 140 typically keep the ab-plane of the high-Tc superconductor substantially parallel to the surface of substrate 140. In FIG. 2C, junction 130 is at an angle relative to the c-direction of the d-wave superconductor. Normally, the deposition of the d-wave superconductor film on substrate 140 keeps the ab-plane of the d-wave superconductor parallel to the surface of substrate 140 and the c-direction perpendicular to the surface. Conventional patterning of the film creates an edge parallel to the c-direction. However, an anisotropic etch process such as electron beam etching with substrate 140 at an angle to the beam direction can create a non-zero angle between the edge of the d-wave film and the c-direction. This angle provides another degree of freedom in selecting a configuration that provides the desired phase difference $\Delta\phi$ in the superconducting order parameter.

Figure 3A:
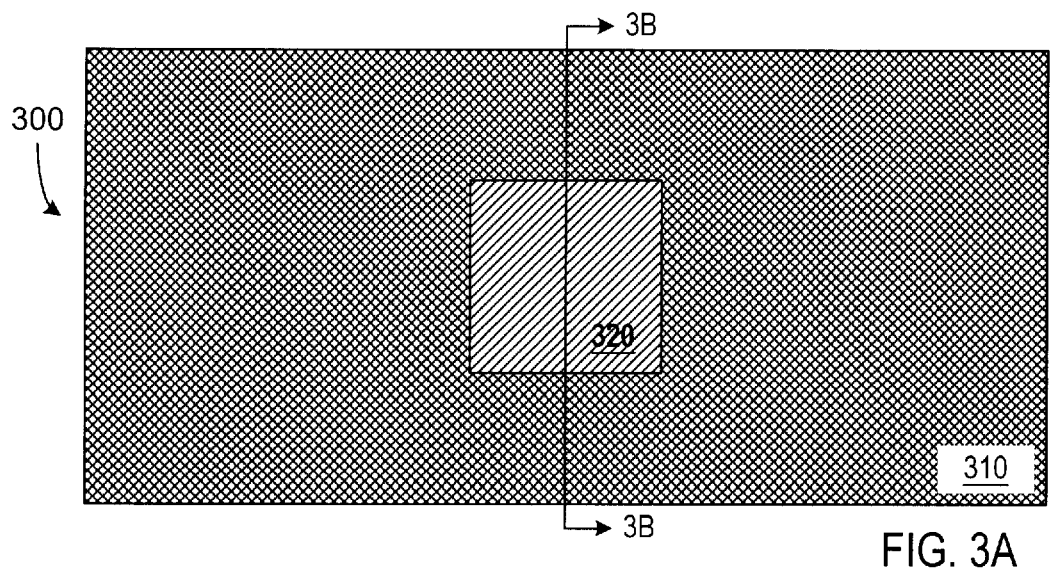
FIGS. 3A and 3B are respectively plan and cross-sectional views of a vertical quantum coherer in accordance with an embodiment of the invention.
Figure 3B:
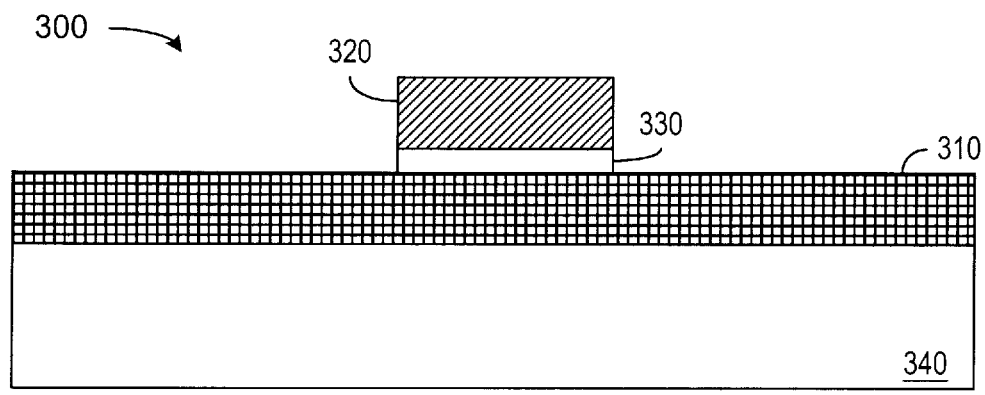

FIGS. 3A and 3B respectively show a plan view and a cross-sectional view of a vertical quantum coherer 300 in accordance with an embodiment of the invention. The terms "horizontal" and "vertical" as applied to the quantum coherers described herein indicate the predominant plane of the ground state supercurrents. Quantum coherer 300 includes an insulating substrate 340, a superconducting bank 310, a Josephson junction 330, and a mesoscopic superconducting island 320. A fabrication process for quantum coherer 300 grows a d-wave superconductor film to a thickness between about 0.2 $\mu$m and about 0.5 $\mu$m on substrate 340. Deposition of a normal conductor such as gold on the d-wave superconductor film forms a normal conductor film between about 0.1 $\mu$m and about 0.3 $\mu$m thick. Deposition of an s-wave superconductor such as Nb on the normal conductive film forms an s-wave superconductor film less than about 0.2 $\mu$m thick. Finally, patterning of the s-wave superconductor film and the normal conductor film creates mesoscopic, superconductive island 320 that Josephson junction 330 separated from superconductive bank 310.

Figure 4A:
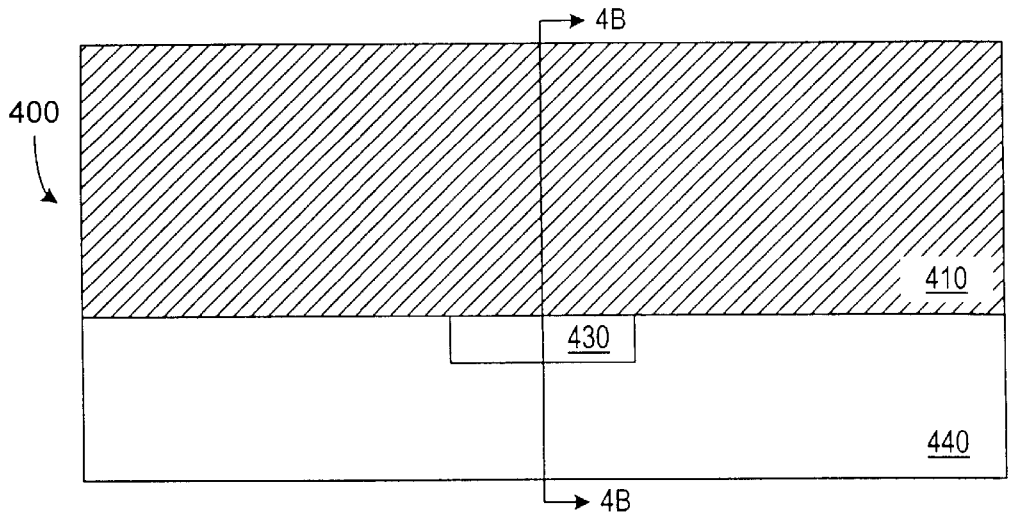
FIGS. 4A and 4B are respectively plan and cross-sectional views of a vertical quantum coherer in accordance with another embodiment of the invention.
Figure 4B:
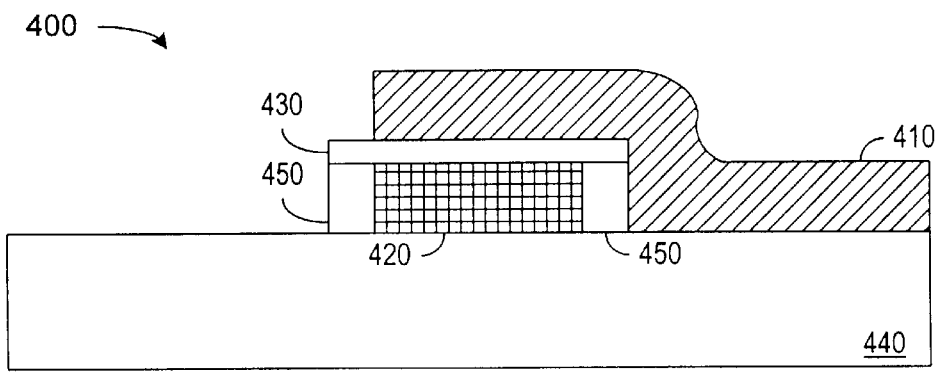

FIGS. 4A and 4B respectively show plan and cross-sectional views of a quantum coherer 400 having a vertical architecture according to another embodiment of the invention. Quantum coherer 400 includes a superconductor bank 410, a mesoscopic superconductor island 420, and a Josephson junction 430, formed on an insulating substrate 440. A fabrication process for quantum coherer 400 grows a d-wave superconductor film on substrate 440 to a thickness less than about 0.2 $\mu$m and patterns the film to form island 420. Insulative sidewall spacers 450 are then formed on island 420. Such spacers can be conventionally formed by depositing and patterning an insulative layer or by a self-aligned process that anisotropically etches a conformal insulative layer formed on substrate 440 and island 420. A layer of a normal conductor such as gold is deposited on the resulting structure to a thickness between about 0.1 $\mu$m and about 0.3 $\mu$m and patterned to form a normal conductive region of Josephson junction 430. The normal conductive region extends over island 420 and at least part of sidewall spacers 440. Finally, a layer of an s-wave superconductor is deposited on the structure and patterned (if necessary) to form bank 410. The thickness of bank 410 is not critical to the operation of quantum coherer 400.

Figure 5:
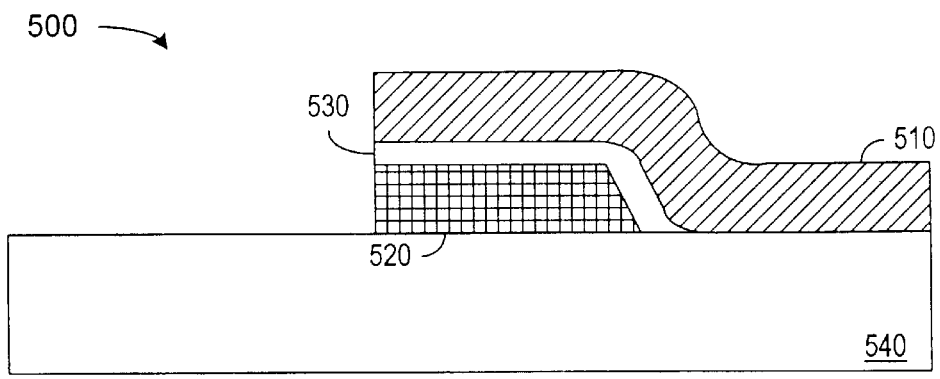
FIGS. 5 is cross-sectional views of a hybrid vertical/horizontal quantum coherer in accordance with an embodiment of the invention.

FIG. 5 shows a cross-sectional view of a quantum coherer 500 having a hybrid vertical/horizontal architecture according to another embodiment of the invention. Quantum coherer 500 includes a superconductor bank 510, a mesoscopic superconductor island 520, and a Josephson junction 530, formed on an insulating substrate 540. A fabrication process for quantum coherer 500 grows a d-wave superconductor film on substrate 440 to a thickness less than about 0.2 $\mu$m and patterns the film to form island 520. The patterning can leave sides of island 520 perpendicular to the surface of substrate 540 or any desired angle. A layer of a normal conductor such as gold is deposited on the resulting structure to a thickness between about 0.1 $\mu$m and about 0.3 $\mu$m and patterned to form a normal conductive region of Josephson junction 530. In this embodiment, the normal conductive region extends over island 520 and is in contact with at least one sidewall of island 520. Finally, a layer of an s-wave superconductor is deposited on the structure and patterned (if necessary) to form bank 510. The phase difference in the superconducting order parameter from bank 510 to island 520 depends on the relative crystal orientation between the top surface of island 520 and the overlying part of bank 510 and the relative crystal orientation of the side of island 520 and the adjacent part of bank 510.

The quantum coherers such as described above avoid the destructive effects of low energy thermal excitations for several reasons. In particular, the superconducting gap (between the ground state energy of Cooper pairs and the higher energy states of electrons) and the small phase volume available in the nodes of the d-wave order parameter in the superconducting island and the bank suppress the low energy elementary excitations. Moreover, near the boundary, there is a possibility of specific admixture of s-wave superconductivity restoring the finite energy gap on all of the Fermi surface. In a normal layer of the junction, where the order parameter is suppressed, the elementary excitations are gapped due to size quantization.

One application of the quantum coherers is in a random number generator. In this application, the quantum states of a set of quantum coherers evolve to a state where each quantum coherer has an equal (or at least known) probability of being in each of the current direction states. The current-directions states are then determined, for example, by observing each quantum coherer with a magnetic force microscope or another magnetic probe. Each determined state (clockwise or counterclockwise) corresponds to a bit value (0 or 1) so that the collection of determined states provides a random binary value having as many bits as there are quantum coherers in the set. Quantum theory indicates that a series of bits thus generated are random without correlation or repetition.

Figure 6:
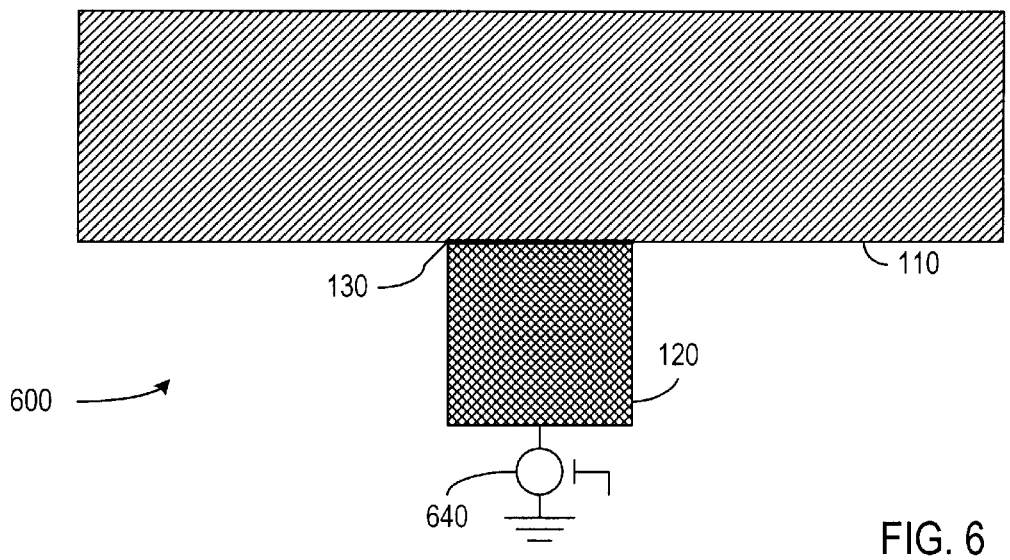
FIG. 6 shows a qubit having a single electron transistor that freezes the state of the qubit.

FIG. 6 shows an embodiment of a qubit 600 based on the architecture of quantum coherer 100. Qubit 600 is merely an illustrative embodiment of a qubit in accordance with the invention, and other embodiments of qubit can employ other quantum coherer architectures such as but not limited to those described above.

Qubit 600 combines quantum coherer 100 with external circuitry that allows freezing of the quantum tunneling between the two degenerate supercurrent ground states. To freeze the quantum state of the supercurrent, a parity key or single electron transistor (SET) 640 connects island 120 to ground (normal or superconducting). The free passage of electrons between island 120 and ground collapses the wavefunction of the supercurrent at junction 130 into one of the ground states (a state corresponding to either phase difference $\Delta\phi$ or $-\Delta\phi$) having definite magnetic moment. (The probability of collapsing to a particular phase difference $\Delta\phi$ or $-\Delta\phi$ depends on probability amplitudes in the ground state before the collapse.) Island 120 remains in the definite magnetic moment state while SET 640 continues to connect island 120 to ground, and that state, while frozen, can be measured to read out and determine the results of a calculation. Changing the gate voltage of SET 640 can stop the flow of electrons to or from ground and thereby allows island 120 to evolve according to the tunneling rate between the ground states.

Single electron transistors are known and described, for example, by A. Zagoskin, "Quantum Theory of Many-Body Processes", which is hereby incorporated by reference in its entirety. SETs include a grain capacitively coupled to two devices (e.g., island 120 and ground). An electron or Cooper pair can tunnel from either device onto the grain when the grain is uncharged. However, the grain is small enough that once an electron or Cooper pair tunnels onto the grain, the charging of the grain electrically repels and prevents further tunneling onto the grain. A gate associated with the grain can change the voltage of grain to shut off or otherwise control the tunneling rate. P. Joyez et al., "Observation of Parity-Induced Suppression of Josephson Tunneling in the Superconducting Single Electron Transistor", Physical Review Letters, Vol. 72, No. 15, Apr. 11, 1994 describes operation and manufacture of single electron transistors and is also incorporated by reference herein in its entirety.

Qubit 600 is referred to herein as a permanent readout superconducting qubit (PRSQ) because barring thermal fluctuations, the spontaneous flux of a frozen (grounded and collapsed) qubit remains fixed. Accordingly, a readout device such as a magnetic force microscope (MFM) tip or a superconducting quantum interferometer device (SQUID) loop can contact the system when the decohering effects of the read out device will not disrupt the qubit result. The readout device measures the weak local magnetic fields that the spontaneous supercurrents (clockwise and counterclockwise) cause in the vicinity of the Josephson junction 130. More particularly, the MFM scans a microscopic magnetized tip attached to a cantilever across the surface and measures deformation of the cantilever as the mechanical force that acts on the magnetized tip. Alternatively, a SQUID loop detects the magnetic flux in the vicinity of the Josephson junction 130. Another possible read system may use a difference in the absorption of circularly polarized microwave radiation due to the clockwise or counterclockwise currents at the junction.

Figure 7:
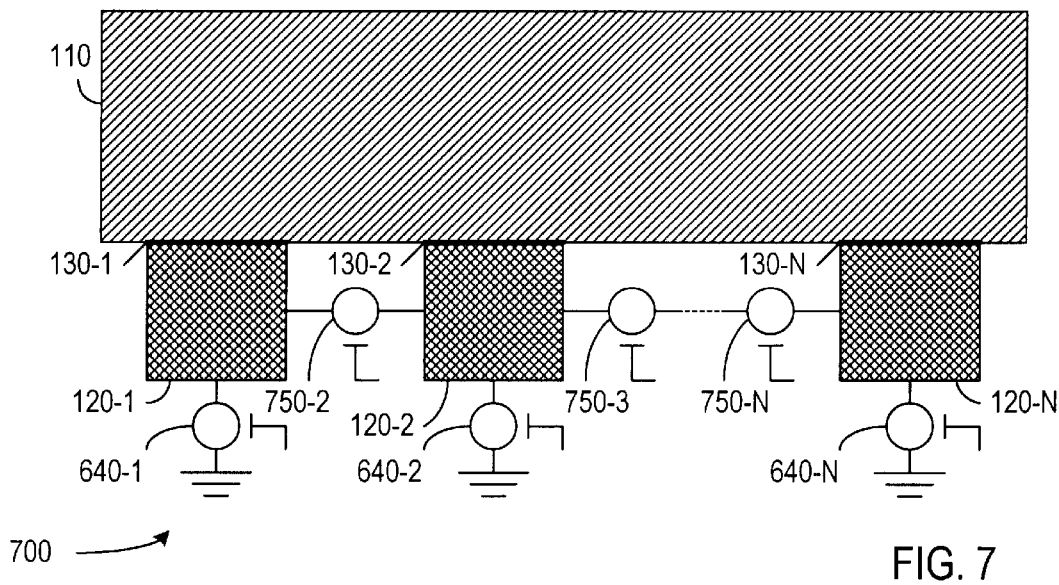
FIG. 7 shows a structure including a collection of qubits having single electron transistors that create entanglements among the qubits and facilitate read out of the qubits.

FIG. 7 shows a PRSQ register 700 including several islands 120-1 to 120-N in contact with a bank 110. In the exemplary embodiment, islands 120-1 to 120-N and bank 110 are made of a d-wave superconductor at a temperature of about 10° K as described above. Grain boundaries are between bank 110 and respective islands 120-1 to 120-N and form clean Josephson junctions 130-1 to 130-N, respectively. The crystal orientations of islands 120-1 to 120-N differ from the crystal orientation of bank 110 and control equilibrium phase differences $\Delta\phi_1$ to $\Delta\phi_N$ between the phase of the order parameter in bank 110 and the phases of the order parameter in islands 120-1 to 120-N. Phases $\Delta\phi_1$ to $\Delta\phi_N$ can differ from each other or all be the same. A manufacturer of PRSQ register 700 selects phases $\Delta\phi_1$ to $\Delta\phi_N$ according to the application of register 700 and designs a substrate that will create the desired grain boundaries when d-wave superconductive material is deposited on the substrate.

To facilitate readout from PRSQ register 700, SETs 640-1 to 640-N are between islands 120-1 to 120-N and ground. Turning on SETs 640-1 to 640-N permits free current between ground and respective islands 120-1 to 120-N to collapse and freeze the quantum states of the supercurrents at respective junctions 130-1 to 130-N. The techniques described above can then read the quantum states.

Register 700 also includes SETs 750-2 to 750-N that connect adjacent islands 120-1 to 120-N. Voltages applied to the gates of SETs 750-2 to 750-N control currents or tunneling probabilities between islands and thereby create controllable entanglements among the quantum states of supercurrents in register 700.

In FIG. 7, islands 120-1 to 120-N are in a linear array, and each island 120-2 to 120-N has a corresponding SET 750-2 to 750-N that connects to the respective preceding islands 750-1 to 750-(N-1) in the linear array. Alternative configurations are possible, for example, an additional SET can connect island 120-1 to island 120-N in a ring. In another embodiment, each island connects through multiple SETs to other islands, for example, in a two-dimensional array of qubits. The configuration and connections of islands can be selected according to the function of or program for PRSQ register 700.

To execute quantum computing with PRSQ register 700, the states of the qubits corresponding to islands 120-1 to 120-N are first initialized in the same manner as described above, for example, by running a current through bank 110.

All of SETs 640-1 to 640-N are off to prevent interaction with ground, and the voltages on the gates of SETs 750-2 to 750-N are adjusted according to the desired calculation. SETs 750-2 to 750-N create entanglements that enable tunneling between the ground states of PRSQ register 700. After the quantum state of PRSQ register 700 evolves to complete the desired calculation, SETs 750-2 to 750-N are turned off to decouple the qubits, and then SETs 640-1 to 640-N are turned on. This collapses the wavefunction so that the supercurrent at each Josephson junction 130-1 to 130-N has a definite magnetic moment. One or more read out devices sense the magnetic moments of the supercurrents at junctions 130-1 to 130-N to determine the results of the quantum computing.

The time required for a calculation and the interpretation of the read out results depends on the calculation performed. Such issues are the subject of many papers on quantum computing. The structures described herein can perform such calculations provided that the structures provide a sufficient number of qubits and a decoherence time that is longer than the required calculation time. The structures can typically achieve longer coherence times by decreasing the operating temperature.

Figure 8:
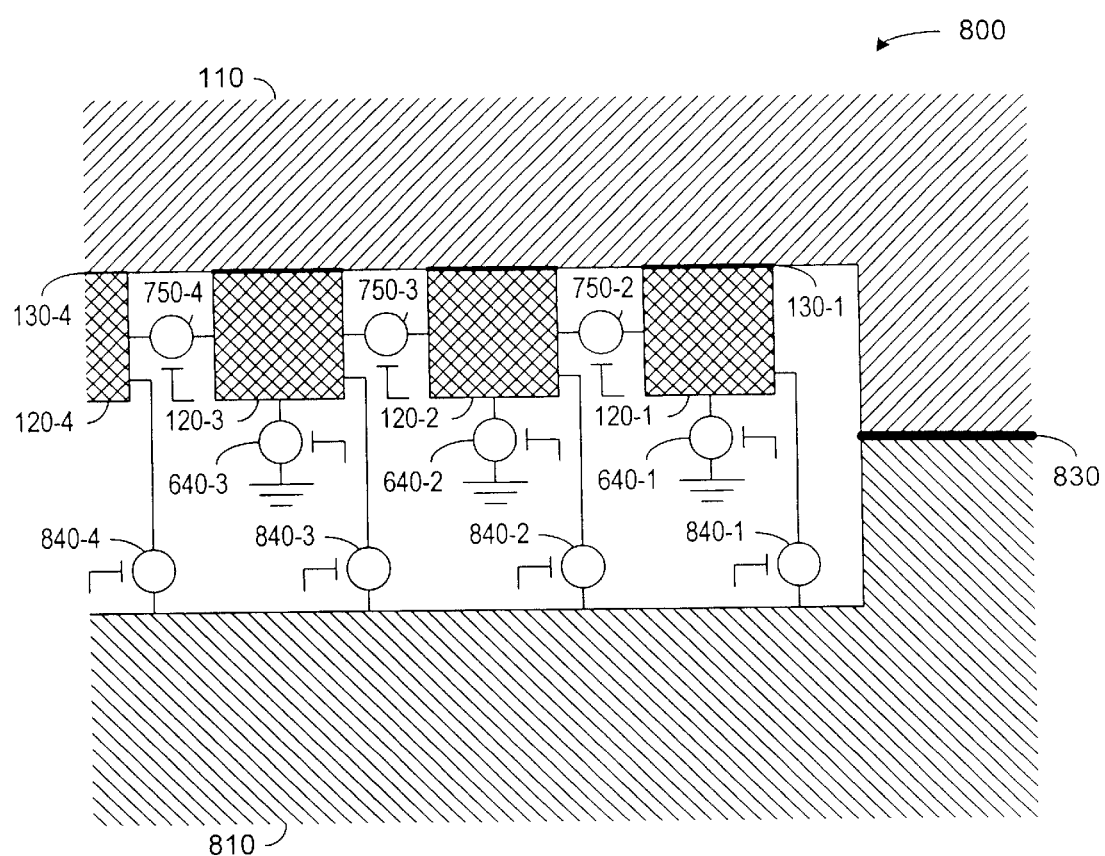
FIG. 8 illustrates a system having a double bus capable of applying different phases of the order parameter from the buses to the qubit.

FIG. 8 illustrates a quantum register 800 having a double bus configuration. Quantum register 800 includes a first superconducting bank 110 and a second superconducting bank 810 with a Josephson junction 830 between the banks. Josephson junction 830 creates a phase difference $\Delta\phi$ between the order parameter in bank 110 and the order parameter in bank 120. Josephson junction 830 is preferably a clean Josephson junction so that phase difference $\Delta\phi$ depends on the relative crystal orientations of banks 110 and 120, but junction 830 is alternatively an insulative or dirty Josephson junction. Superconducting islands 120-1 to 120-N connect to bank 110 via respective clean Josephson junctions 130-1 to 130-N.

Quantum register 800 includes three sets of SETs. SETs 640-1 to 640-N connect to respective islands 120-1 to 120-N to ground. SETs 750-2 to 750-N connect adjacent islands for controlled entanglements. SETs 840-1 to 840-N are between respective islands 120-1 to 120-N and bank 810. An advantage of quantum register 800 is the ability to change the initialization and ground-state tunneling probabilities by selecting which, if any, of SETs 840-1 to 840-N connect corresponding islands 120-1 to 120-N to bank 810.

To illustrate an initialization process using double-bus quantum register 800, let the phase of the superconducting order parameter in bus 110 be zero. The relative phase $\chi$ of bus 810 can be created by connecting bus 110 and 810 on the left of FIG. 8 and passing an external magnetic field through the left most portion of the resulting loop. Opening selected keys 840-1 to 840-N (while keys 640-1 to 640-N remain closed) creates an energy difference between the two previously degenerate ground states in the corresponding islands 120-1 to 120-N. In particular, the states with phases $+\Delta\phi$ and $-\Delta\phi$ when connected to bus 810 differ in energy with the energy difference being proportional to $[\cos(\Delta\phi+\chi)-\cos(\Delta\phi-\chi)]$. The connected islands 120-1 to 120-N eventually settle to the lowest energy state $+\Delta\phi$ or $-\Delta\phi$ depending on the phase $\chi$ of bus 810.

Although the invention has been described with reference to particular embodiments, the description is only an example of the invention's application and should not be taken as a limitation. Various adaptations and combinations of features of the embodiments disclosed are within the scope of the invention as defined by the following claims.

I claim:

1. A quantum computing method comprising:

cooling a structure including a superconducting bank and a superconducting mesoscopic island to a temperature that suppresses thermal excitations in said structure sufficiently to suppress thermal sources of decoherence, the structure including a clean Josephson junction between the superconducting mesoscopic island and the superconducting bank;

establishing a quantum state of a supercurrent at the junction, wherein the quantum state is an admixture of a first state having a first magnetic moment and a second state having a second magnetic moment;

allowing the quantum state of the supercurrent at the junction to evolve according to probabilities for tunneling between the first and second state; and measuring magnetic flux at the junction to determine a result of the quantum computing.

2. The method of claim 1, wherein the supercurrent at the junction is a ground-state current arising from a d-wave superconductor in the structure.

3. The method of claim 1, wherein measuring magnetic flux comprises: grounding the island to fix the supercurrent in the first or second state; and measuring the magnetic flux while the island is grounded.

4. The method of claim 1, wherein establishing the quantum state comprises running a current through the bank.

5. A quantum computing method comprising:

cooling a structure including a superconducting bank and a plurality of superconducting mesoscopic islands to a temperature that suppresses thermal excitations in said structure sufficiently to suppress thermal sources of decoherence, the structure including a separate clean Josephson junction between each superconducting island in said plurality of superconducting mesoscopic islands and the superconducting bank;

establishing a separate quantum state of a supercurrent at each said junction in said plurality of junctions, wherein the separate quantum state is an admixture of a first state having a first magnetic moment and a second state having a second magnetic moment;

allowing each said quantum state of the supercurrent at each said junction to evolve according to probabilities for tunneling between the first and second state; and measuring magnetic flux at each said separate junction to determine a result of the quantum computing.

6. The method of claim 5, wherein said allowing each said quantum state of the supercurrent at each said junction to evolve further comprises controlling a conductivity of a transistor that couples a first and second mesoscopic island in said plurality of mesoscopic islands together so that an entanglement of the quantum states of said first and second islands is created.

7. The method of claim 5, wherein said establishing said separate quantum state comprises running a current through the bank.

8. The method of claim 7, wherein, for each island in said plurality of mesoscopic islands, a crystal orientation is selected for said mesoscopic island in order to achieve a Josephson junction between said mesoscopic island and said bank that provides said mesoscopic island with a predetermined quantum state.

9. The method of claim 1, wherein said establishing said quantum state comprises running a current through the bank.

10. The method of claim 1, wherein allowing the supercurrent at the junction to evolve includes providing a tunneling operation.

11. The method of claim 1, wherein allowing the supercurrent at the junction to evolve includes providing a bias operation.

12. The method of claim 5, wherein allowing the supercurrent at the junction to evolve includes providing a tunneling operation.

13. The method of claim 5, wherein allowing the supercurrent at the junction to evolve includes providing a bias operation.

14. The method of claim 5, wherein allowing the supercurrent at the junction to evolve includes providing a entanglement operation.

* * * * *